United States Patent
Marimuthu et al.

(10) Patent No.: US 9,721,922 B2
(45) Date of Patent: Aug. 1, 2017

(54) SEMICONDUCTOR DEVICE AND METHOD OF FORMING FINE PITCH RDL OVER SEMICONDUCTOR DIE IN FAN-OUT PACKAGE

(71) Applicant: STATS ChipPAC, Ltd., Singapore (SG)

(72) Inventors: Pandi C. Marimuthu, Singapore (SG); Yaojian Lin, Singapore (SG); Won Kyoung Choi, Singapore (SG); Il Kwon Shim, Singapore (SG)

(73) Assignee: STATS ChipPAC, Pte. Ltd., Singapore (SG)

( * ) Notice: Subject to any disclaimer, the term of this patent is extended or adjusted under 35 U.S.C. 154(b) by 267 days.

(21) Appl. No.: 14/139,614

(22) Filed: Dec. 23, 2013

(65) Prior Publication Data

US 2015/0179570 A1    Jun. 25, 2015

(51) Int. Cl.
*H01L 29/66* (2006.01)
*H01L 25/065* (2006.01)
(Continued)

(52) U.S. Cl.
CPC ...... *H01L 25/0652* (2013.01); *H01L 23/5383* (2013.01); *H01L 23/5384* (2013.01); *H01L 23/5385* (2013.01); *H01L 23/5389* (2013.01); *H01L 24/97* (2013.01); *H01L 21/561* (2013.01); *H01L 21/568* (2013.01); *H01L 23/3114* (2013.01); *H01L 2224/16225* (2013.01); *H01L 2924/12041* (2013.01); *H01L 2924/12042* (2013.01); *H01L 2924/13091* (2013.01);
(Continued)

(58) Field of Classification Search
CPC ............... H01L 23/3135; H01L 23/481; H01L 23/49811; H01L 24/97; H01L 24/73; H01L 24/81; H01L 25/03; H01L 25/0657
See application file for complete search history.

(56) References Cited

U.S. PATENT DOCUMENTS

| 8,242,543 B2 | 8/2012 | Chandrasekaran et al. |
| 2009/0170242 A1* | 7/2009 | Lin ............... H01L 21/6835 438/107 |

(Continued)

*Primary Examiner* — Trung Q Dang
(74) *Attorney, Agent, or Firm* — Robert D. Atkins; Patent Law Group: Atkins and Associates, P.C.

(57) ABSTRACT

A semiconductor device has a first conductive layer including a plurality of conductive traces. The first conductive layer is formed over a substrate. The conductive traces are formed with a narrow pitch. A first semiconductor die and second semiconductor die are disposed over the first conductive layer. A first encapsulant is deposited over the first and second semiconductor die. The substrate is removed. A second encapsulant is deposited over the first encapsulant. A build-up interconnect structure is formed over the first conductive layer and second encapsulant. The build-up interconnect structure includes a second conductive layer. A first passive device is disposed in the first encapsulant. A second passive device is disposed in the second encapsulant. A vertical interconnect unit is disposed in the second encapsulant. A third conductive layer is formed over second encapsulant and electrically connected to the build-up interconnect structure via the vertical interconnect unit.

23 Claims, 43 Drawing Sheets

(51) Int. Cl.
*H01L 23/538* (2006.01)
*H01L 23/00* (2006.01)
H01L 23/31 (2006.01)
H01L 21/56 (2006.01)

(52) U.S. Cl.
CPC .................. *H01L 2924/181* (2013.01); *H01L 2924/19105* (2013.01)

(56) References Cited

U.S. PATENT DOCUMENTS

| | | | |
|---|---|---|---|
| 2010/0327439 A1* | 12/2010 | Hwang | H01L 23/481 257/737 |
| 2012/0187568 A1* | 7/2012 | Lin | H01L 21/76898 257/774 |
| 2012/0287583 A1 | 11/2012 | Pressel et al. | |
| 2013/0032947 A1* | 2/2013 | Park | H01L 21/568 257/774 |
| 2013/0056879 A1 | 3/2013 | Lin et al. | |
| 2013/0214409 A1 | 8/2013 | Pagaila et al. | |
| 2013/0252383 A1 | 9/2013 | Chen | |
| 2014/0063768 A1* | 3/2014 | Tanaka | H01L 23/3121 361/784 |

* cited by examiner

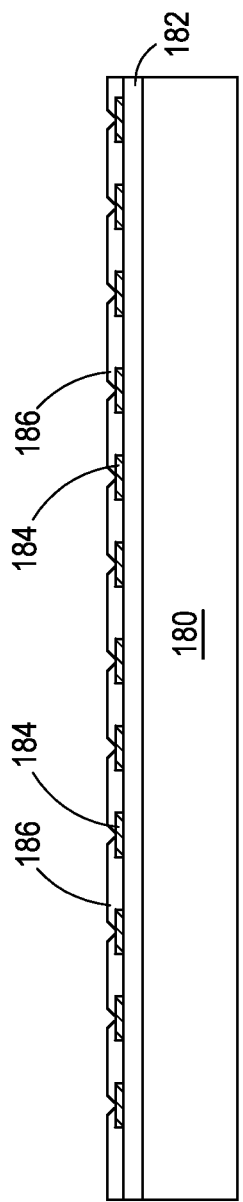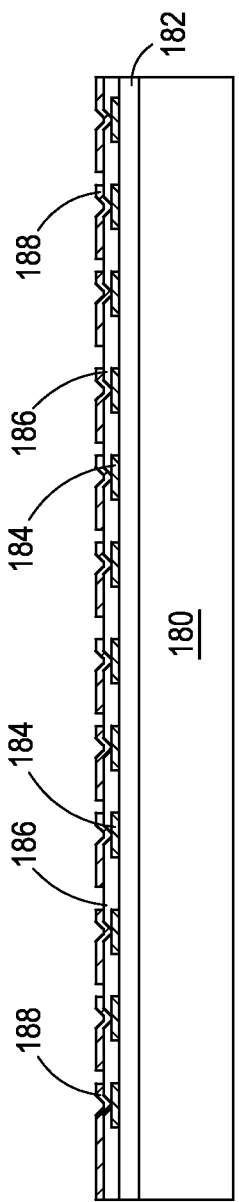

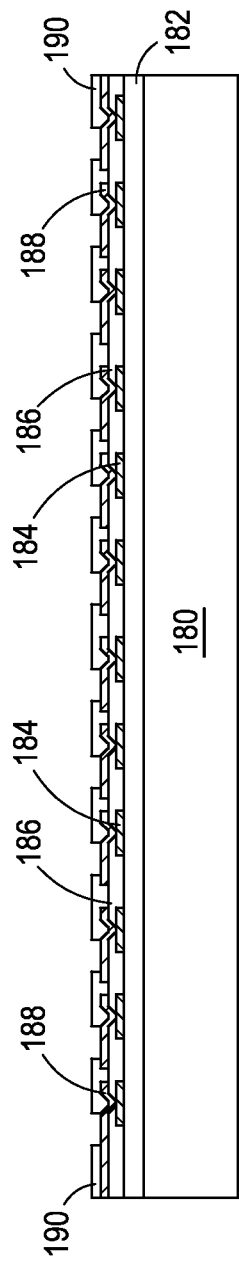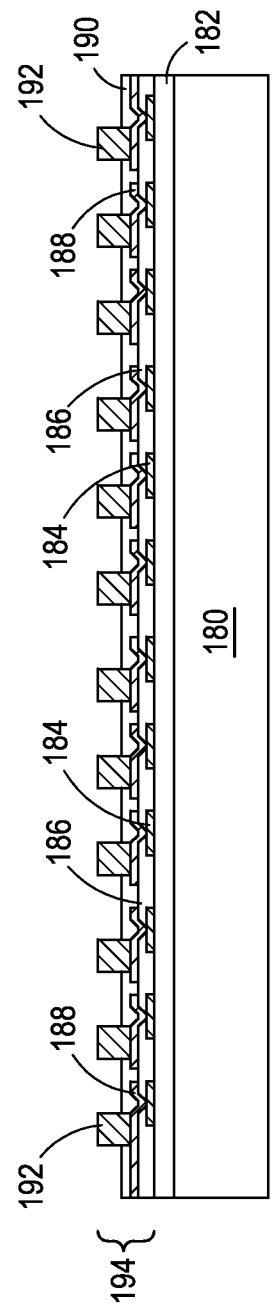

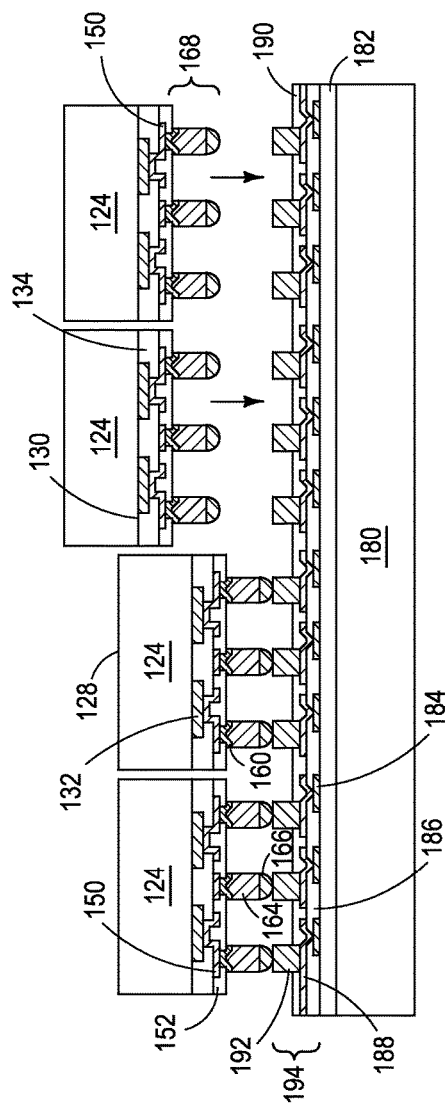
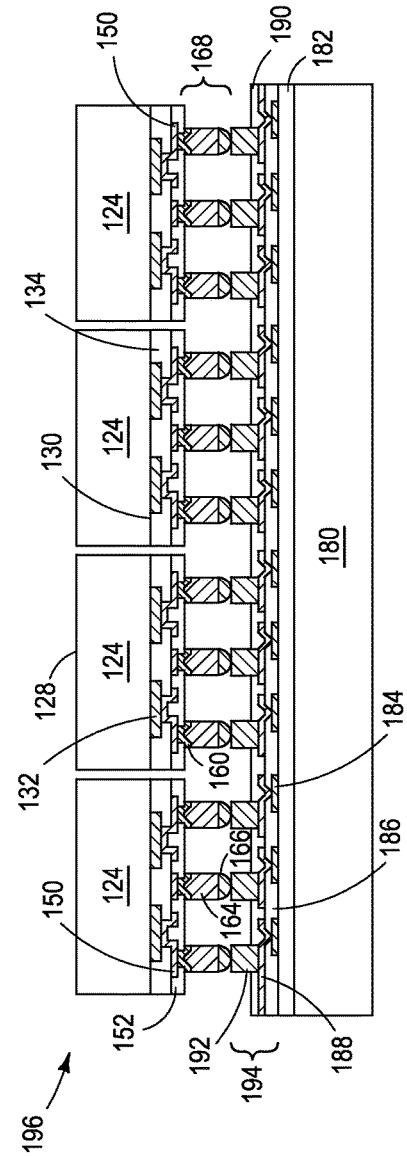

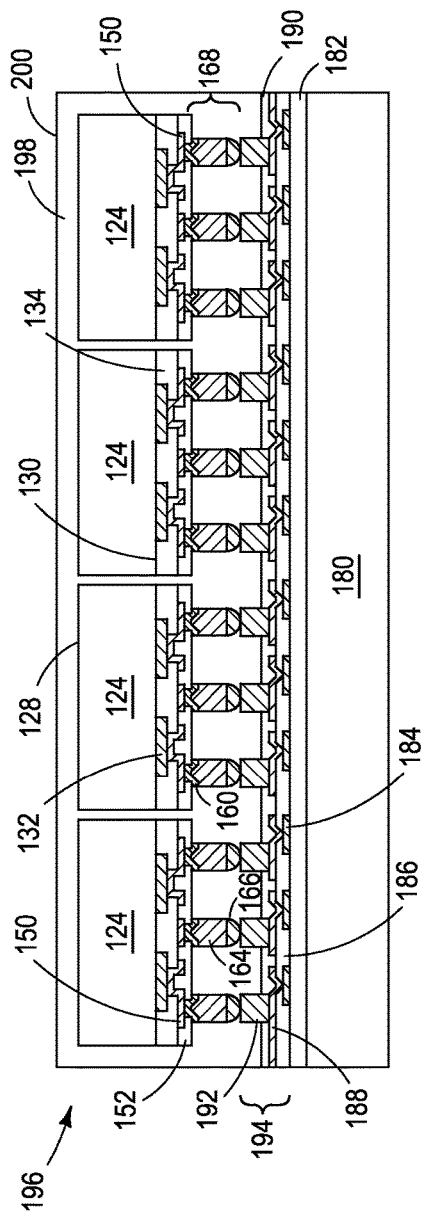
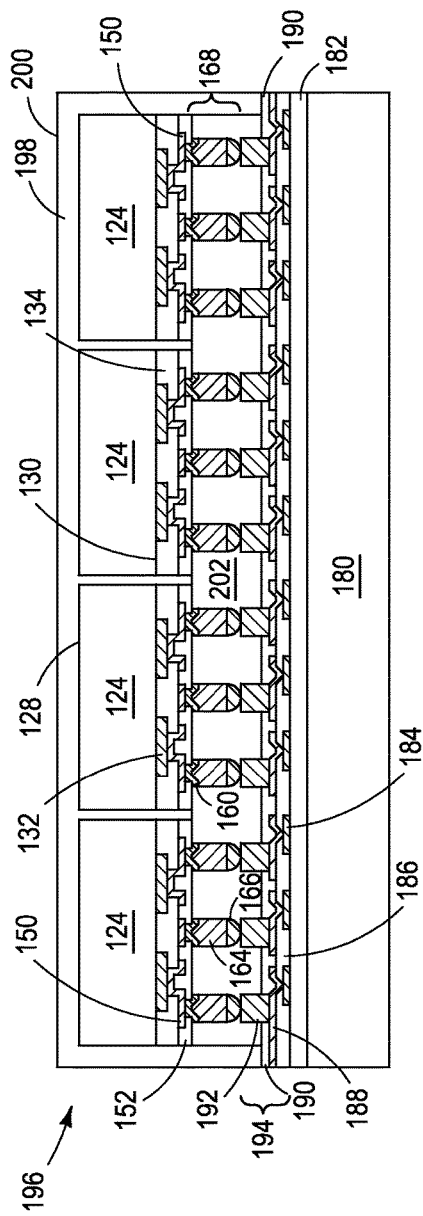

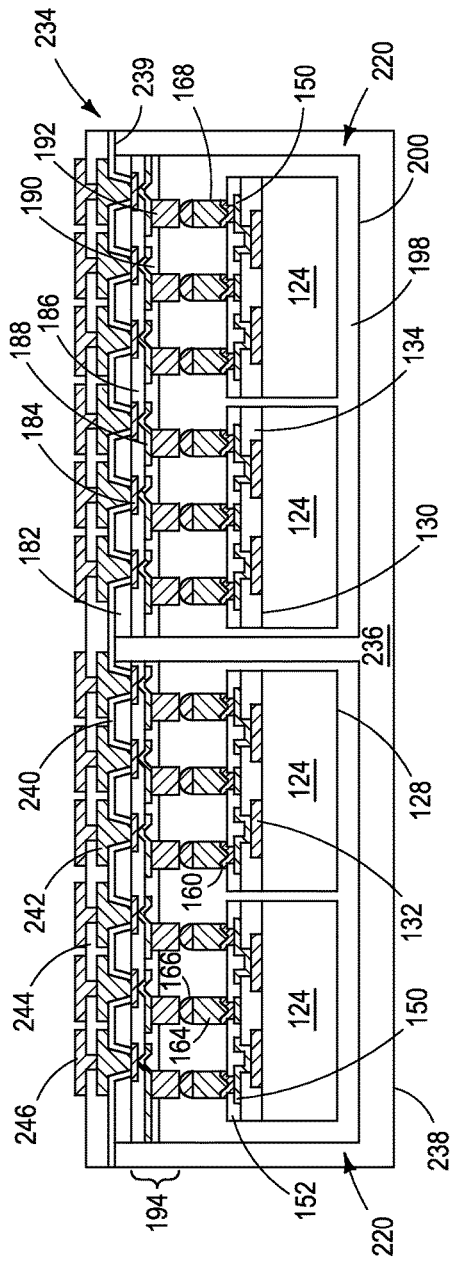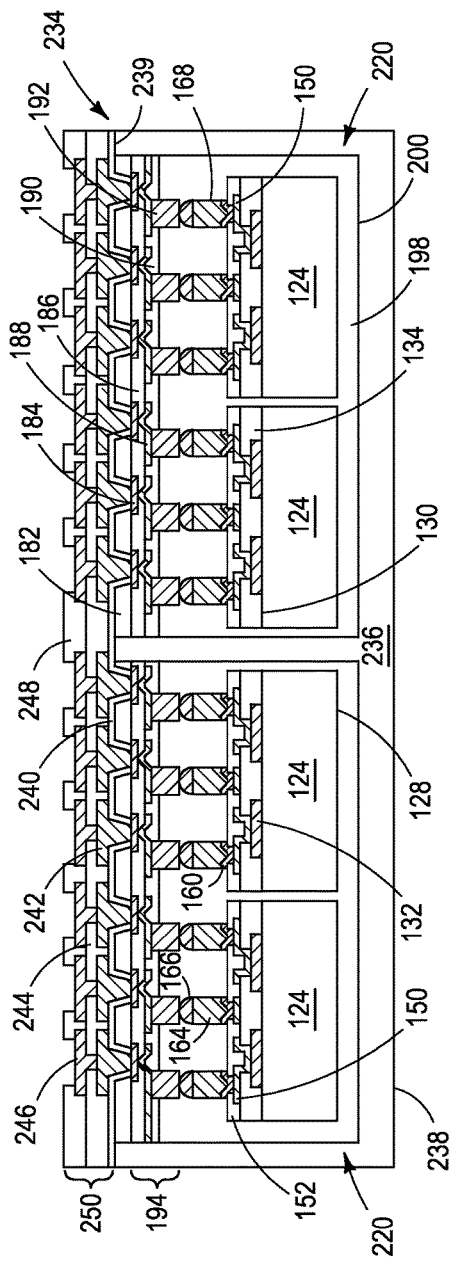

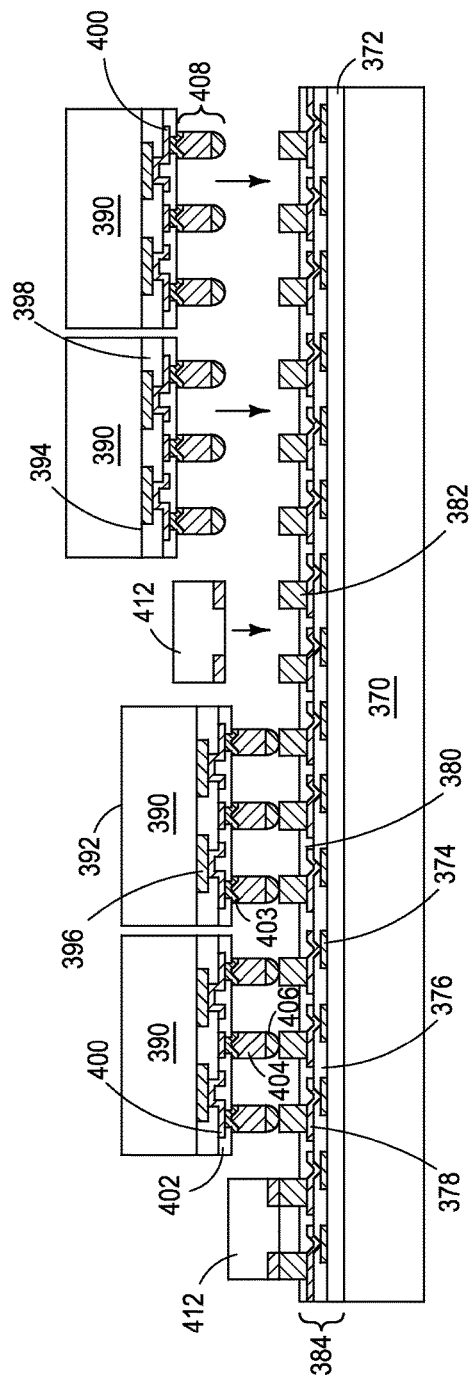
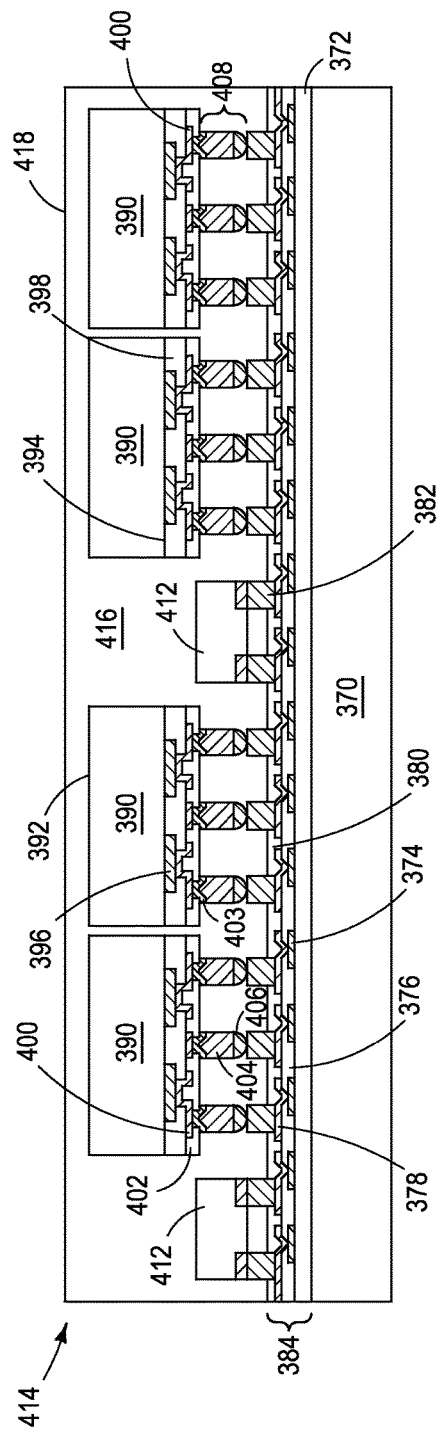
FIG. 6a
FIG. 6b

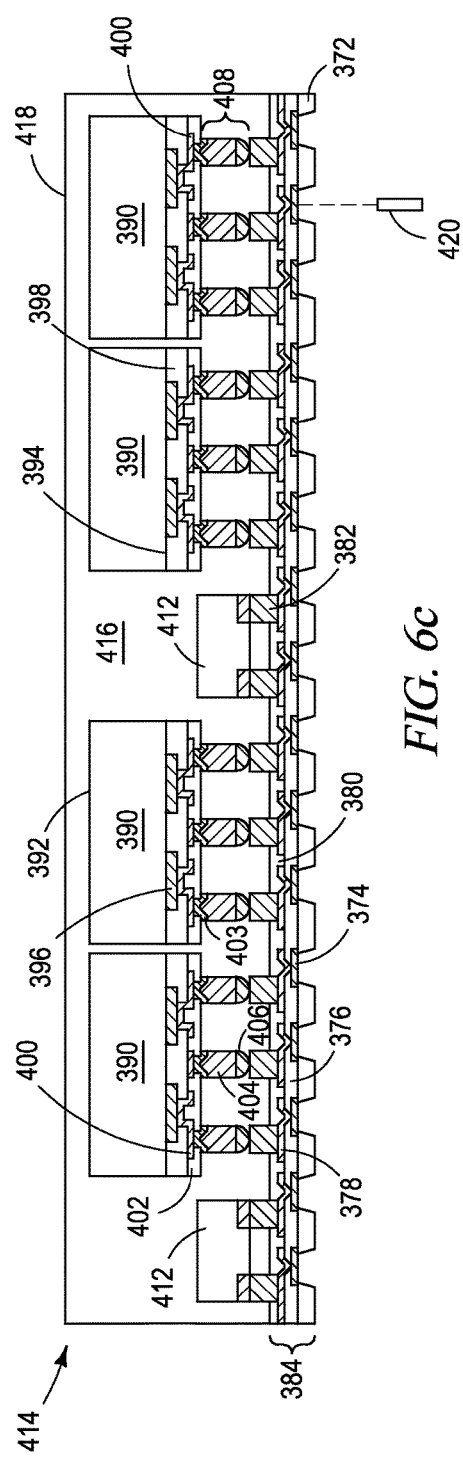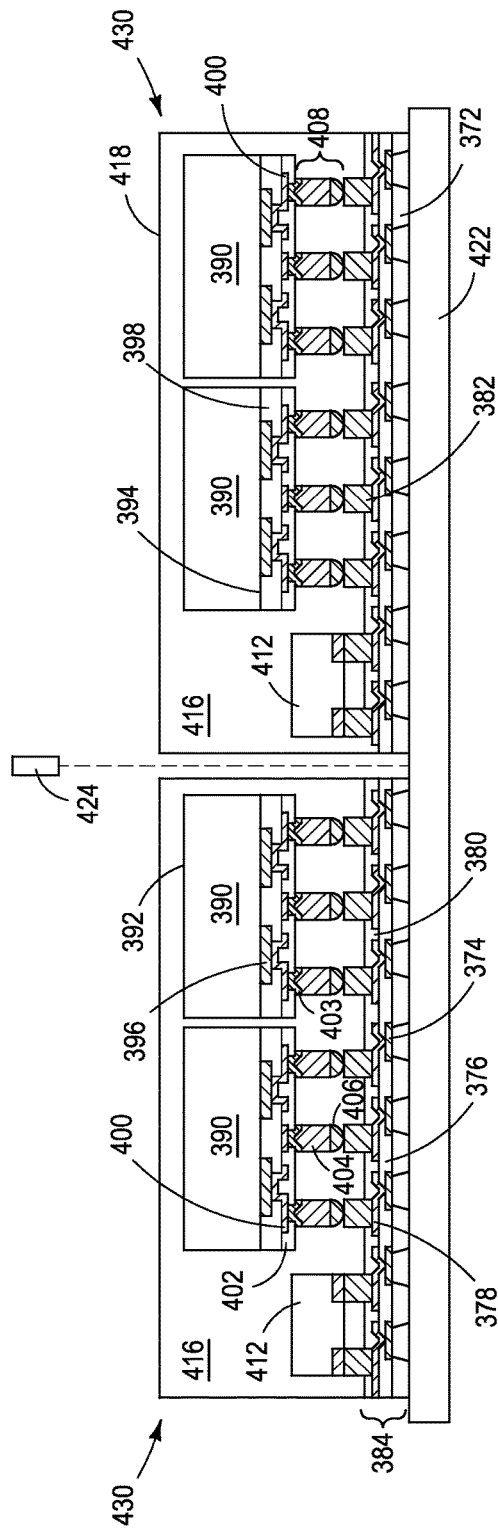

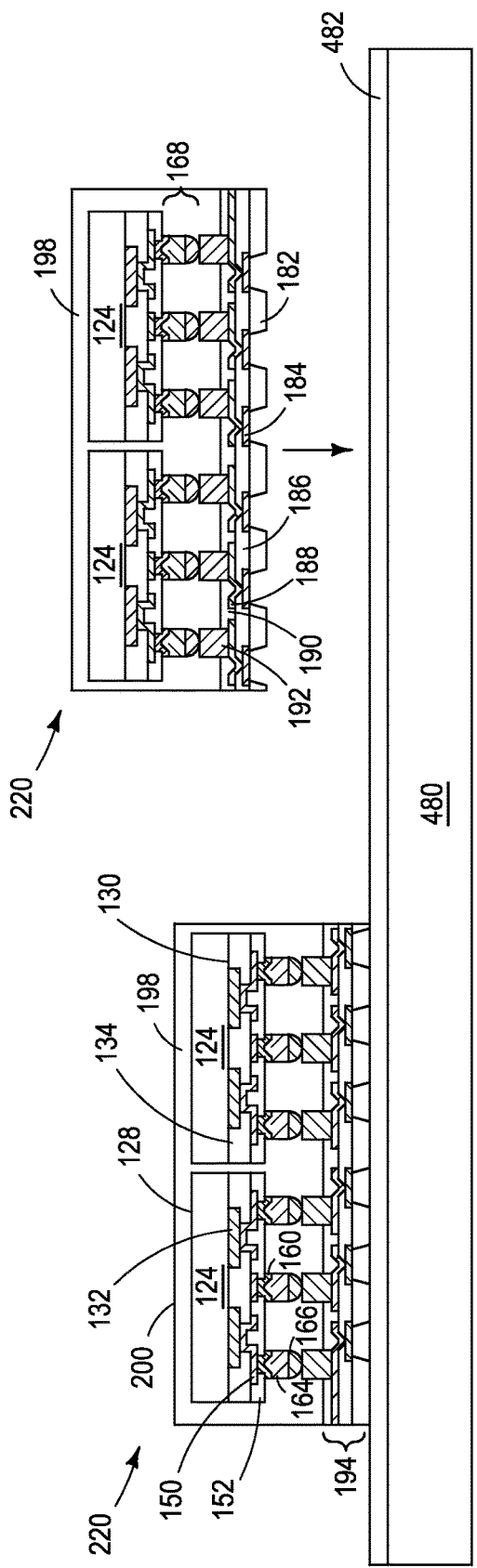

SEMICONDUCTOR DEVICE AND METHOD OF FORMING FINE PITCH RDL OVER SEMICONDUCTOR DIE IN FAN-OUT PACKAGE

FIELD OF THE INVENTION

The present invention relates in general to semiconductor devices and, more particularly, to a semiconductor device and method of forming fine pitch RDL over semiconductor die in a fan-out package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

One approach to achieving the objectives of greater integration and smaller semiconductor devices is to focus on 2.5-D packaging technologies, i.e., electrical interconnection between adjacent semiconductor die within a device, and 3-D packaging technologies, i.e., electrical interconnection between vertically stacked semiconductor die or package-on-package (PoP) semiconductor devices.

In a fan-out embedded wafer level ball grid array (Fo-eWLB), electrical interconnect between adjacent semiconductor die, and between the semiconductor die and external devices is provided through a build-up interconnect structure. The build-up interconnect structure is formed over the semiconductor die and an encapsulant that surrounds the semiconductor die. The build-up interconnect structure typically includes multiple redistribution layers (RDL). When forming a build-up interconnect structure with fine or narrow pitch RDL, for example RDL having a pitch of 5 microns ($\mu$m), the encapsulated semiconductor die are bonded to a temporary carrier to prevent warpage during formation of the build-up interconnect structure. After the build-up interconnect structure is formed, a plurality of interconnect structures, for example conductive bumps, is formed over the build-up interconnect structure and then the temporary carrier is removed. Bonding and debonding the temporary carrier to the encapsulated semiconductor die adds steps to the manufacturing process, increases manufacturing time and cost, and reduces throughput. In addition, forming an Fo-eWLB having a build-up interconnect structure with ultra-fine pitch RDL, for example 2 $\mu$m or less, is difficult and involves complex, highly controlled, expensive, and time-consuming manufacturing steps.

The electrical interconnection between adjacent semiconductor die within a device and between the semiconductor die and external devices can also be accomplished by embedding a through silicon vias (TSV) interposer within the semiconductor package. In a 2.5D TSV package, RDL are formed over and conductive TSV are formed through an interposer to provide electrical interconnect. The conductive TSV and RDL route signals between semiconductor die disposed over the interposer and between the semiconductor die and external devices. The RDL formed on a TSV interposer are scalable to a submicron dimension, i.e., in a nanometer range; however, forming a TSV interposer package involves complex, expensive, and time-consuming manufacturing steps. In addition, the vertical interconnects of a TSV interposer consume space and increase the overall height of the package. Accordingly, TSV interposer packages cannot meet the X, Y, and Z, i.e., length, width, and height, requirements of smaller semiconductor devices.

SUMMARY OF THE INVENTION

A need exists for a cost-effective semiconductor package that incorporates the RDL with ultra-narrow pitch of a TSV interposer package and the small form factor, i.e., smaller X, Y, and Z dimensions, of a Fo-eWLB package. Accordingly, in one embodiment, the present invention is a method of making a semiconductor device comprising the steps of providing a substrate, forming a first conductive layer over the substrate, disposing a semiconductor die over the first conductive layer, disposing a first encapsulant over the semiconductor die, removing the substrate, disposing a second encapsulant over the first encapsulant, and forming an interconnect structure over the first conductive layer and second encapsulant.

In another embodiment, the present invention is a method of making a semiconductor device comprising the steps of providing a first conductive layer, disposing a first semiconductor die over the first conductive layer, disposing a first encapsulant over the first semiconductor die, and forming an interconnect structure over the first conductive layer opposite the first semiconductor die.

In another embodiment, the present invention is a semiconductor device comprising a first conductive layer including a plurality of first conductive traces. A first semiconductor die is disposed over a first surface of the first conductive layer. A second conductive layer including a plurality of second conductive traces is disposed over a second surface of the first conductive layer opposite the first surface of the first conductive layer. A pitch of the first conductive traces is less than a pitch of the second conductive traces.

In another embodiment, the present invention is a semiconductor device comprising a first conductive layer and a first semiconductor die disposed over the first conductive layer. An interconnect structure is formed over the first conductive layer opposite the first semiconductor die.

BRIEF DESCRIPTION OF THE DRAWINGS

FIGS. 6a-6i illustrate a process of forming fine pitch RDL and embedding passive devices within a semiconductor device;

FIGS. 8a-8i illustrate a process of forming fine pitch RDL and embedding vertical interconnect units within a semiconductor device;

DETAILED DESCRIPTION OF THE DRAWINGS

Figure 1:
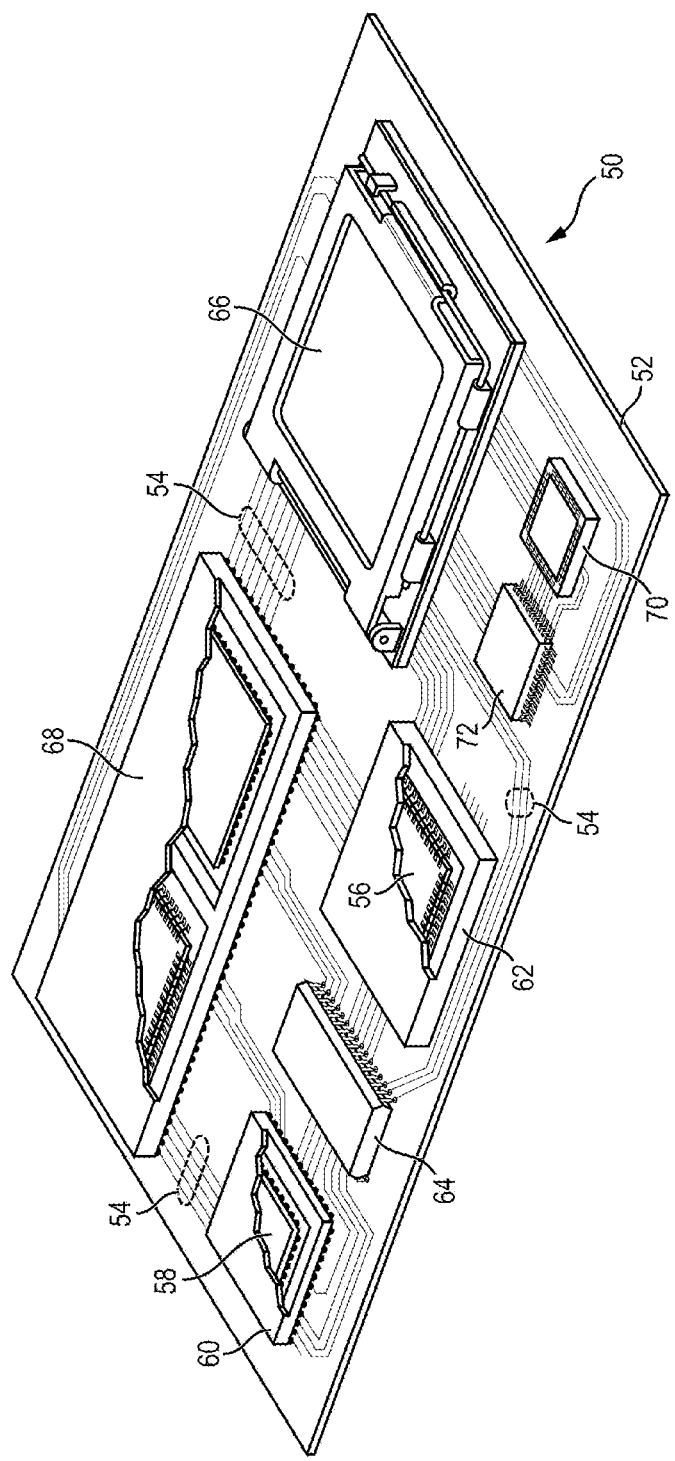
FIG. 1 illustrates a printed circuit board (PCB) with different types of packages mounted to the surface of the PCB.

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
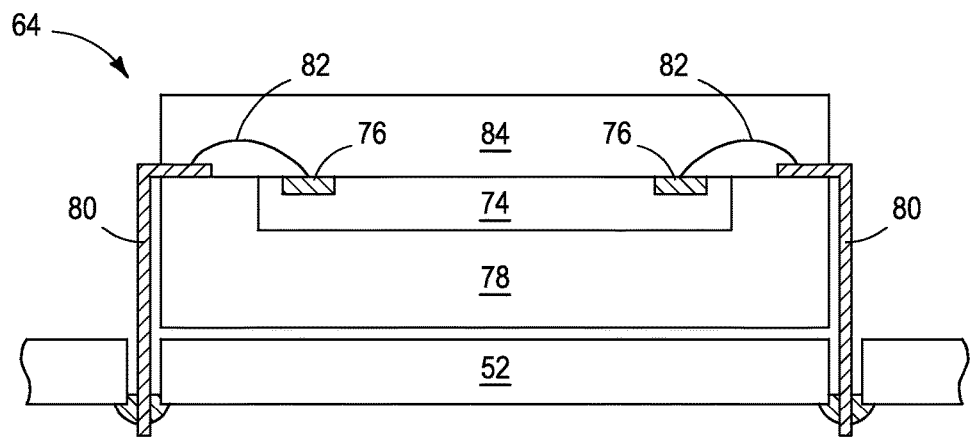
FIGS. 2a-2c illustrate further detail of the representative semiconductor packages mounted to the PCB.
Figure 2B:
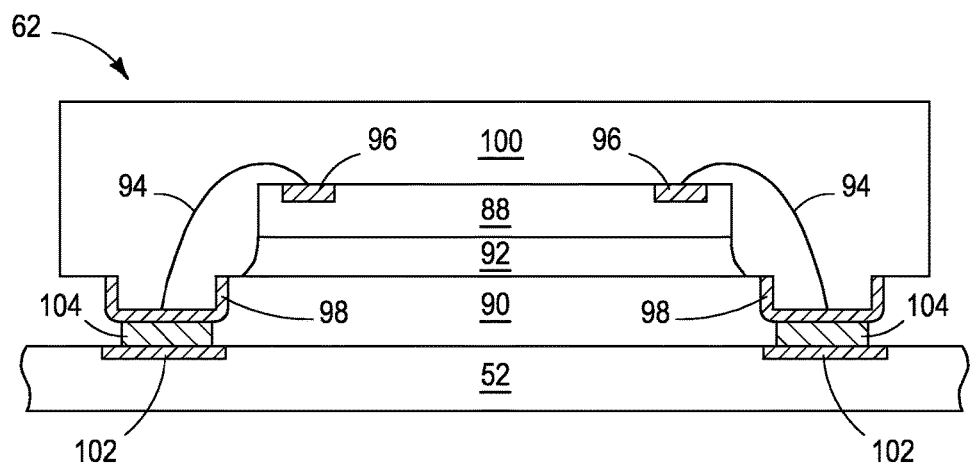
Figure 2C:
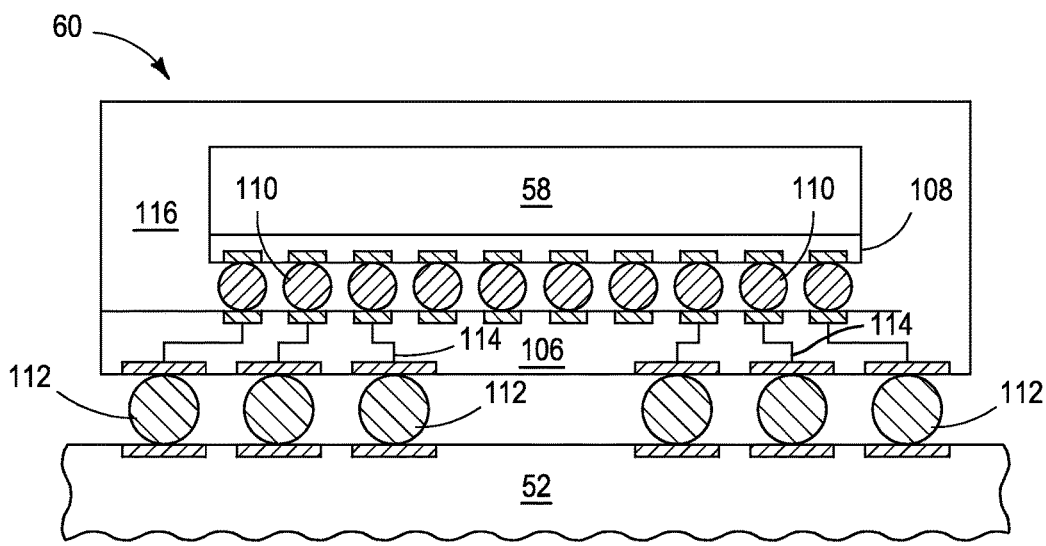

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
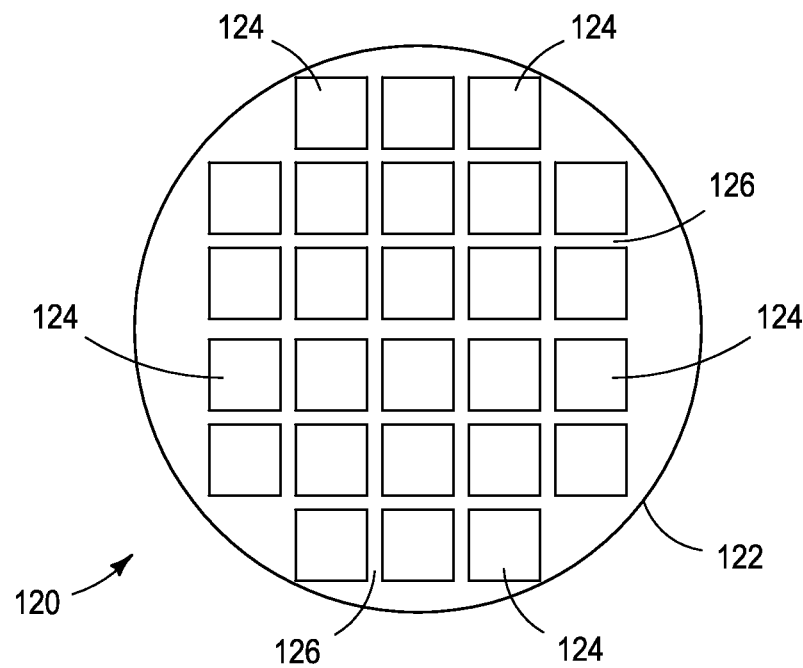
FIGS. 3a-3i illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

Figure 3B:
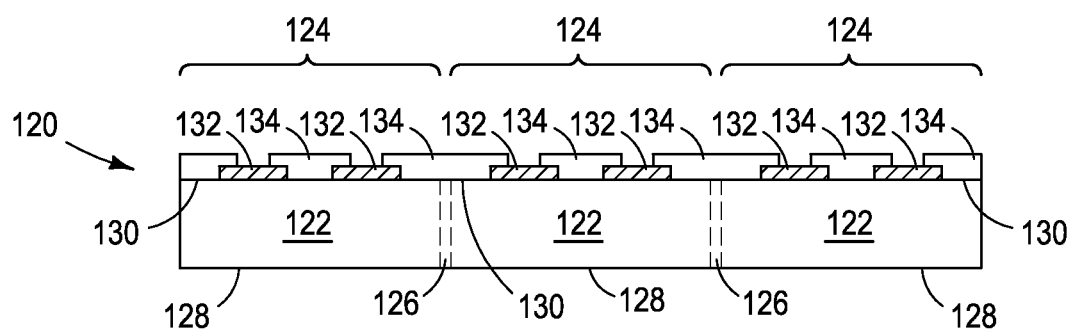

FIG. 3b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 using PVD, CVD, screen printing, spin coating, spray coating, sintering, or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 134 covers and provides protection for active surface 130. A portion of insulating layer 134 is removed by etching, laser direct ablation (LDA), or other suitable process to expose conductive layer 132 for subsequent electrical interconnect.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 3C:
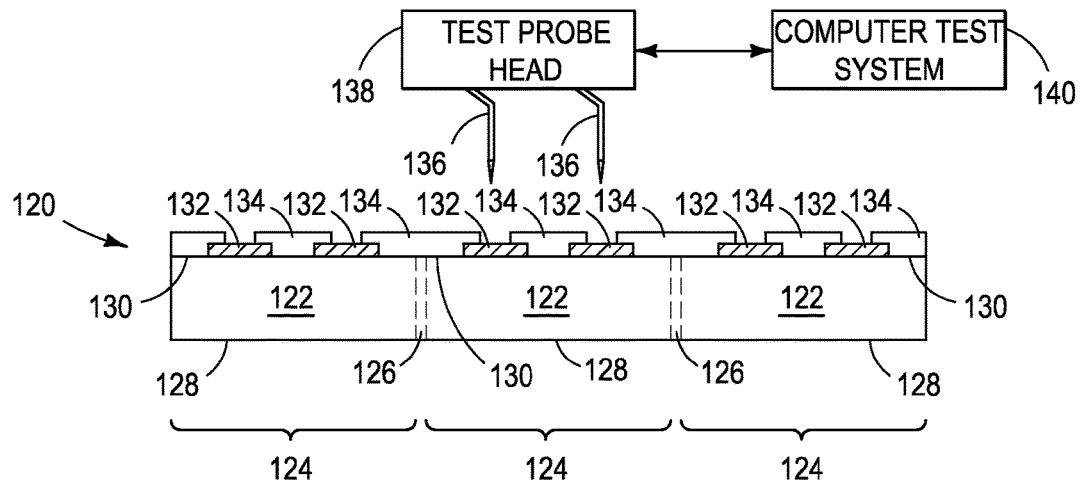

The active and passive components within semiconductor die 124 undergo testing at the wafer level for electrical performance and circuit function. Each semiconductor die 124 is tested for functionality and electrical parameters, as shown in FIG. 3c, using a probe 138 or other testing device. Test probe head 138 includes a plurality of probes 136. Probes 136 are used to make electrical contact with nodes or contact pads 132 on each semiconductor die 124 and provide electrical stimuli to the contact pads. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 3D:
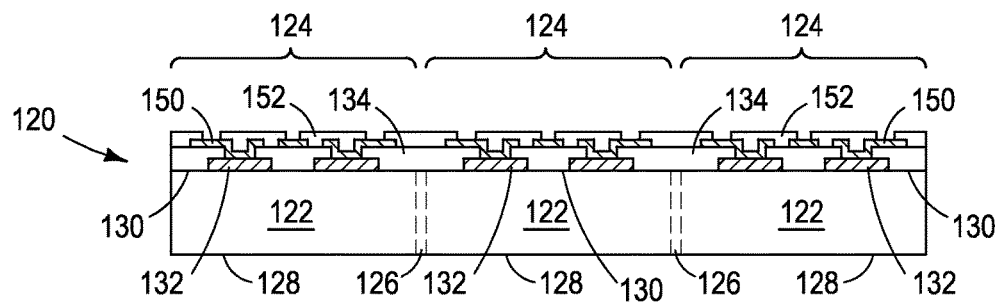

In FIG. 3d, an electrically conductive layer or RDL 150 is formed over conductive layer 132 and insulating layer 134 using PVD, CVD, electrolytic plating, electroless plating process, or other suitable metal deposition process. Conductive layer 150 can be one or more layers of Al, Ti, TiW, Cu, Sn, Ni, Au, Ag, or other suitable electrically conductive material. One portion of conductive layer 150 is electrically connected to conductive layer 132. Other portions of conductive layer 150 can be electrically common or electrically isolated depending on the design and function of semiconductor die 124.

An insulating or passivation layer 152 is formed over insulating layer 134 and conductive layer 150 using PVD, CVD, printing, lamination, spin coating, spray coating, sintering, or thermal oxidation. Insulating layer 152 contains one or more layers of SiO2, Si3N4, SiON, Ta2O5, Al2O3, or other material having similar insulating and structural properties. A portion of insulating layer 152 is removed by LDA, etching, or other suitable process to expose conductive layer 150.

Figure 3E:
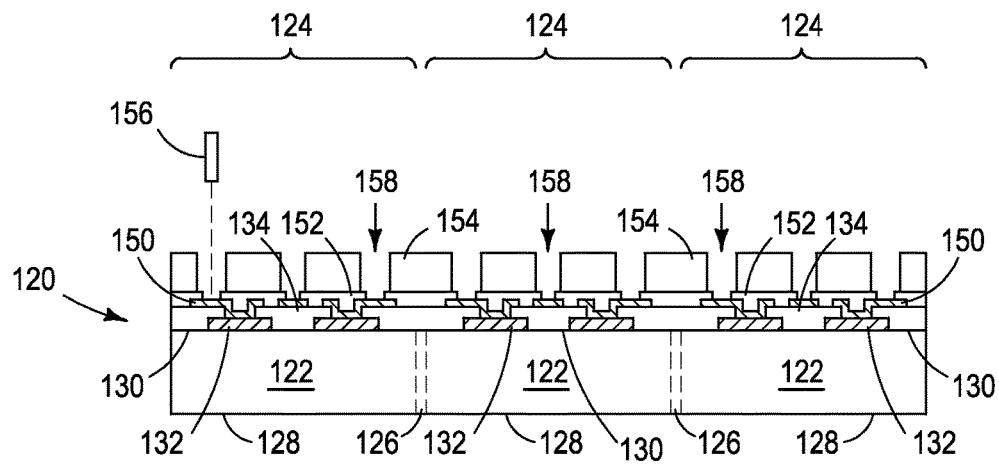

In FIG. 3e, a patterning, or photoresist layer 154 is formed over insulating layer 152 and conductive layer 150 using printing, spin coating, or spray coating. A portion of photoresist layer 154 is removed by LDA using laser 156 to form patterned openings 158 and expose insulating layer 152 and conductive layer 150. Alternatively, the portion of photoresist layer 154 is removed by an etching process through a patterned photoresist layer to form patterned openings 158 and expose insulating layer 152 and conductive layer 150. In one embodiment, patterned openings 158 have a circular cross-sectional area configured to form conductive pillars with a cylindrical shape including a circular cross-section. In another embodiment, patterned openings 158 have a rectangular cross-sectional area configured to form conductive pillars with a cubic shape including a rectangular cross-section.

Figure 3F:
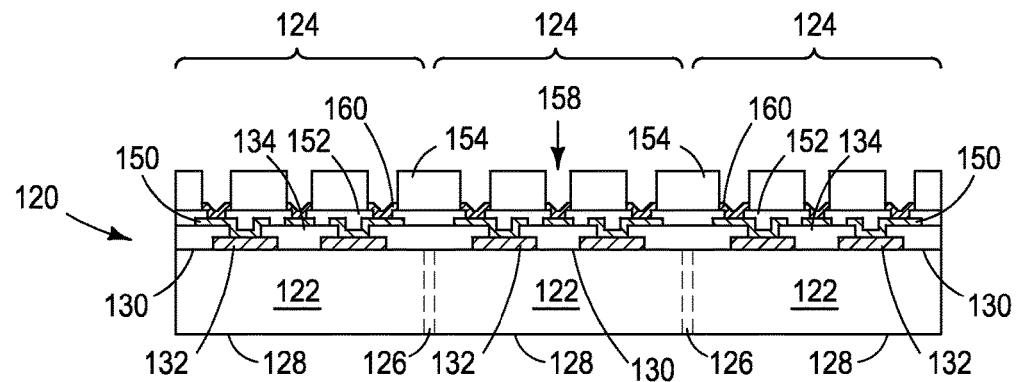

In FIG. 3f, an electrically conductive layer 160 is conformally applied over insulating layer 152 and conductive layer 150, within openings 158, using a patterning and metal deposition process such as printing, PVD, CVD, sputtering, electrolytic plating, and electroless plating. Alternatively, conductive layer 160 can be formed over insulating layer 152 and conductive layer 150 prior to forming photoresist layer 154. Conductive layer 160 can be one or more layers of Al, Cu, Sn, Ti, Ni, Au, Ag, or other suitable electrically conductive material. In one embodiment, conductive layer 160 is a multi-layer stack including a seed layer, barrier layer, and adhesion layer. The seed layer can be titanium copper (TiCu), titanium tungsten copper (TiWCu), or tantalum nitrogen copper (TaNCu). The barrier layer can be Ni, nickel vanadium (NiV), platinum (Pt), palladium (Pd), TiW, CrCu, or other suitable material. The adhesion layer can be Ti, TiN, TiW, Al, or chromium (Cr), or other suitable material. Conductive layer 160 follows the contour of insulating layer 152 and conductive layer 150. Conductive layer 160 is electrically connected to conductive layer 150.

Figure 3G:
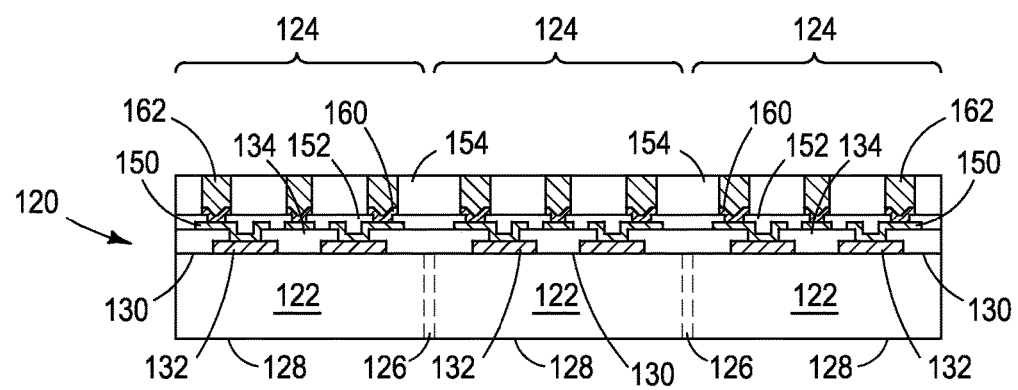

In FIG. 3g, an electrically conductive material 162 is deposited within openings 158 and over conductive layer 160 using an evaporation, sputtering, electrolytic plating, electroless plating, or screen printing process. Conductive material 162 can be Cu, Al, tungsten (W), Au, solder, or other suitable electrically conductive material. In one embodiment, conductive material 162 is deposited by plating Cu in the patterned openings 158 of photoresist layer 154.

Figure 3H:
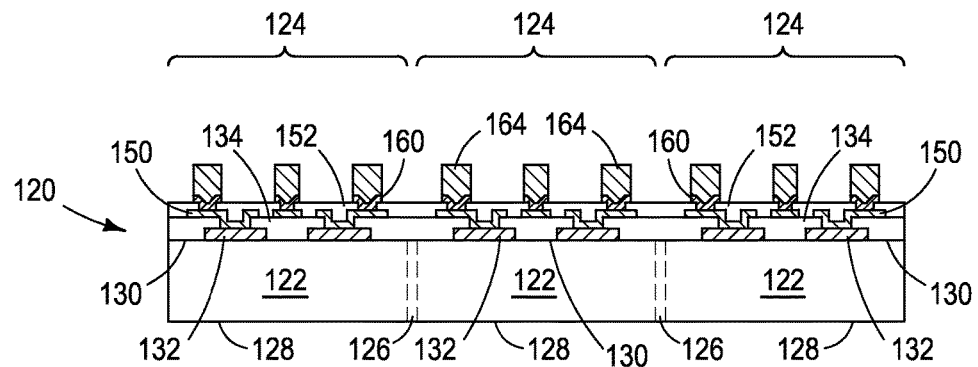

In FIG. 3h, photoresist layer 154 is removed by an etching process to leave individual conductive pillars 164. Conductive pillars 164 can have a cylindrical shape with a circular or oval cross-section, or conductive pillars 164 can have a cubic shape with a rectangular cross-section. In another embodiment, conductive pillars 164 can be implemented with stacked bumps or stud bumps.

Figure 3I:
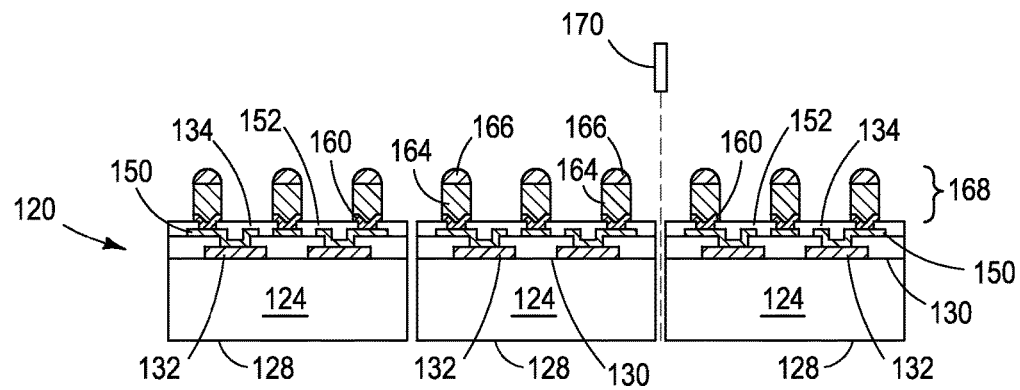

In FIG. 3i, an electrically conductive bump material is deposited over conductive pillars 164 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be reflowed to form a rounded bump cap 166. In some applications, bump caps 166 are reflowed a second time to improve electrical contact to pillars 164. Alternatively, the electrically conductive bump material is deposited prior to removing photoresist layer 154. The combination of conductive pillar 164 and bump cap 166 constitutes a composite interconnect structure 168 with a non-fusible portion (conductive pillar 164) and a fusible portion (bump cap 166). Composite interconnect structures 168 represent one type of interconnect structure that can be formed over semiconductor die 124. The interconnect structure can also use bond wire, bumps, conductive paste, stud bump, micro bump, or other electrical interconnect.

Semiconductor wafer 120 is singulated through saw street 126 using saw blade or laser cutting tool 170 into individual semiconductor die 124. The individual semiconductor die 124 can be inspected and electrically tested for identification of KGD post singulation.

Figure 4I:
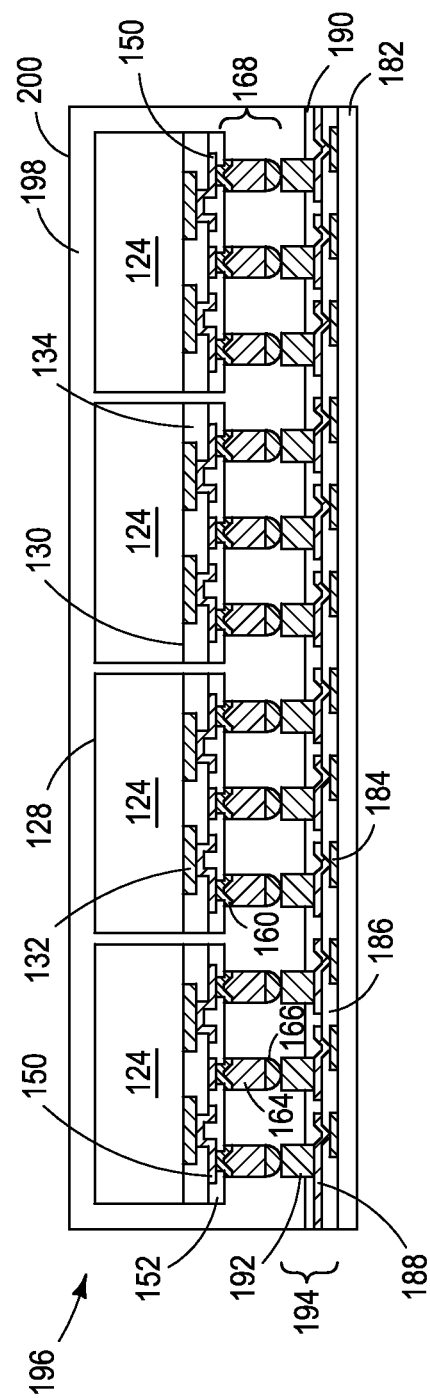
FIGS. 4a-4s illustrate a process of forming a semiconductor device including fine pitch RDL and a build-up interconnect structure.
Figure 4J:
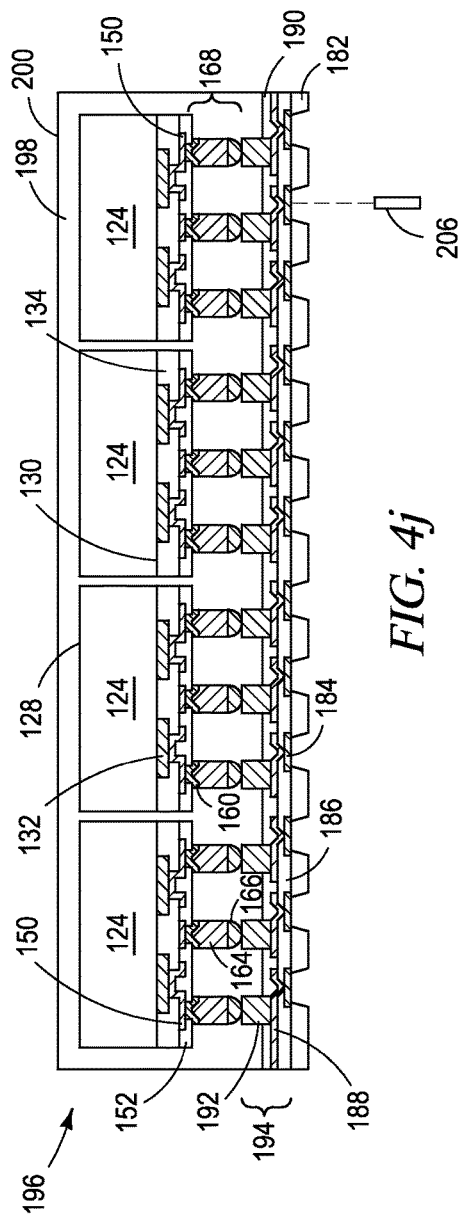
Figure 4K:
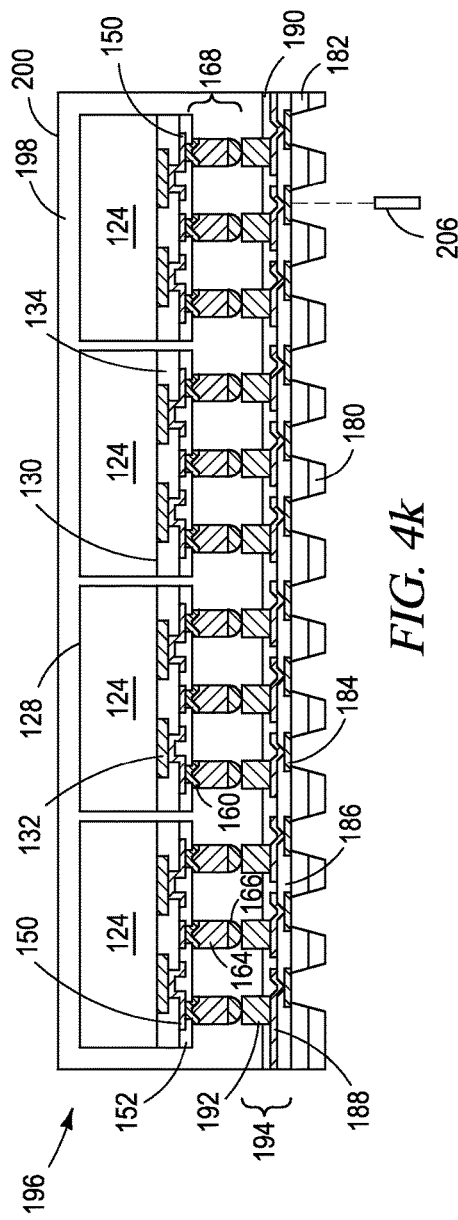
Figure 41:
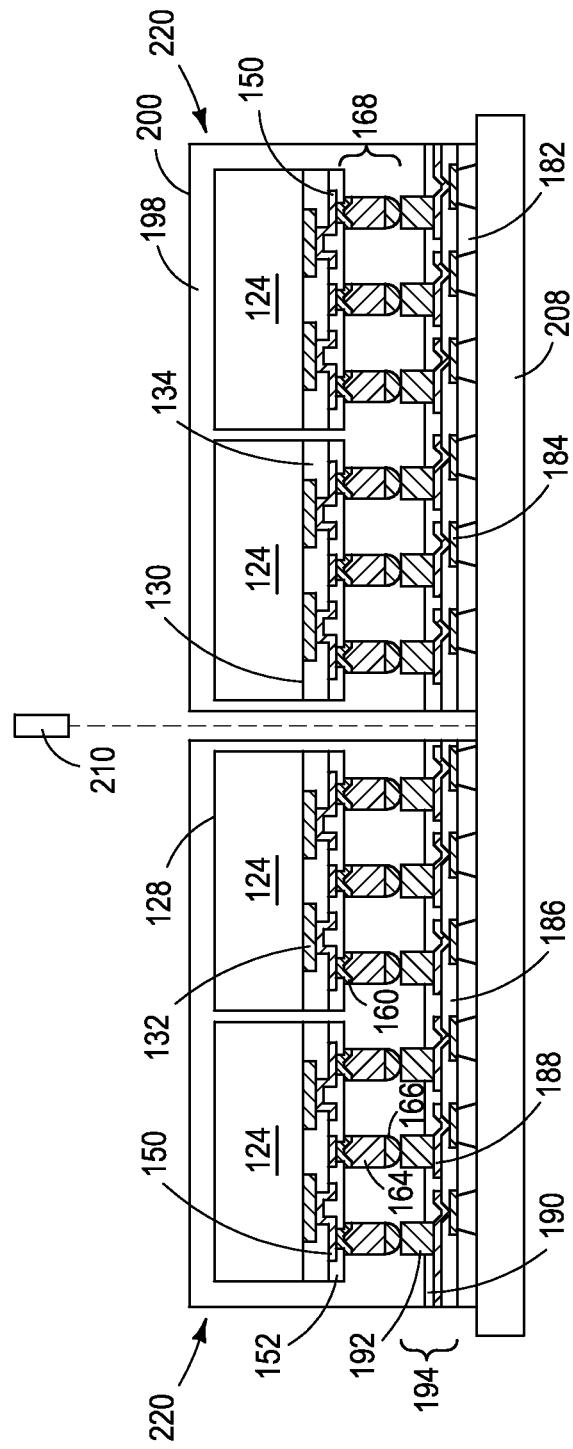
Figure 4M:
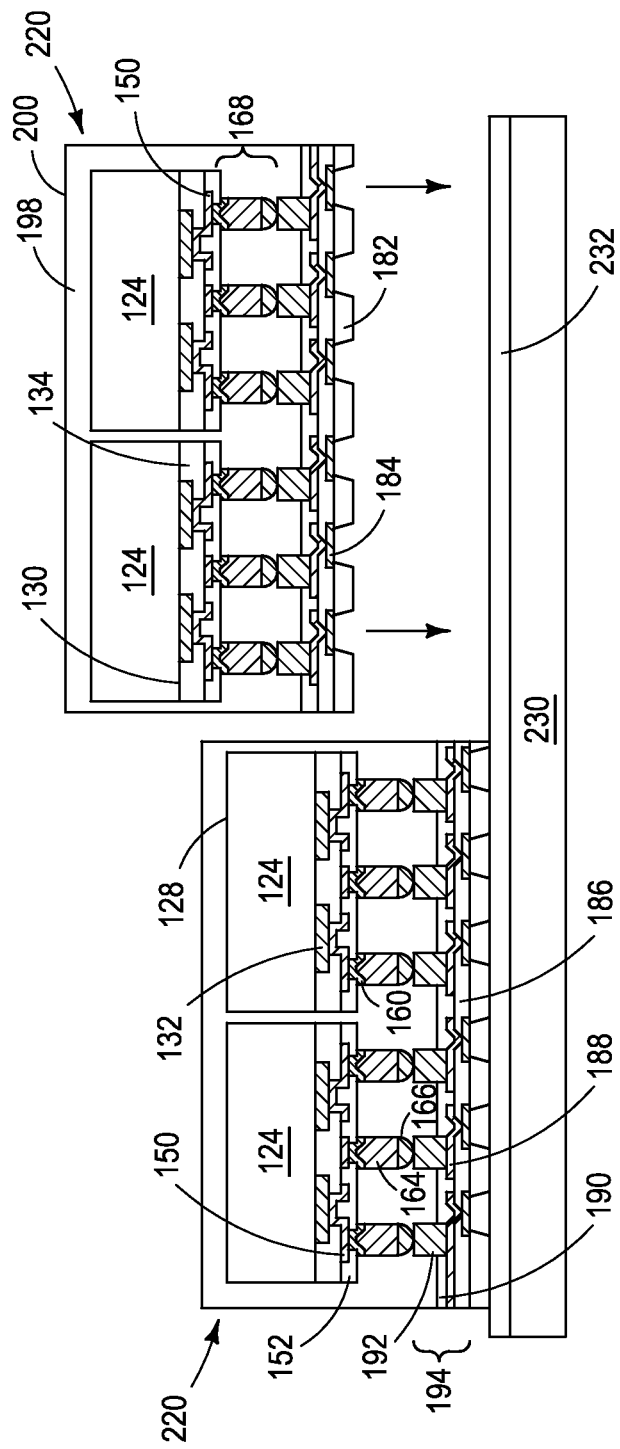
Figure 4N:
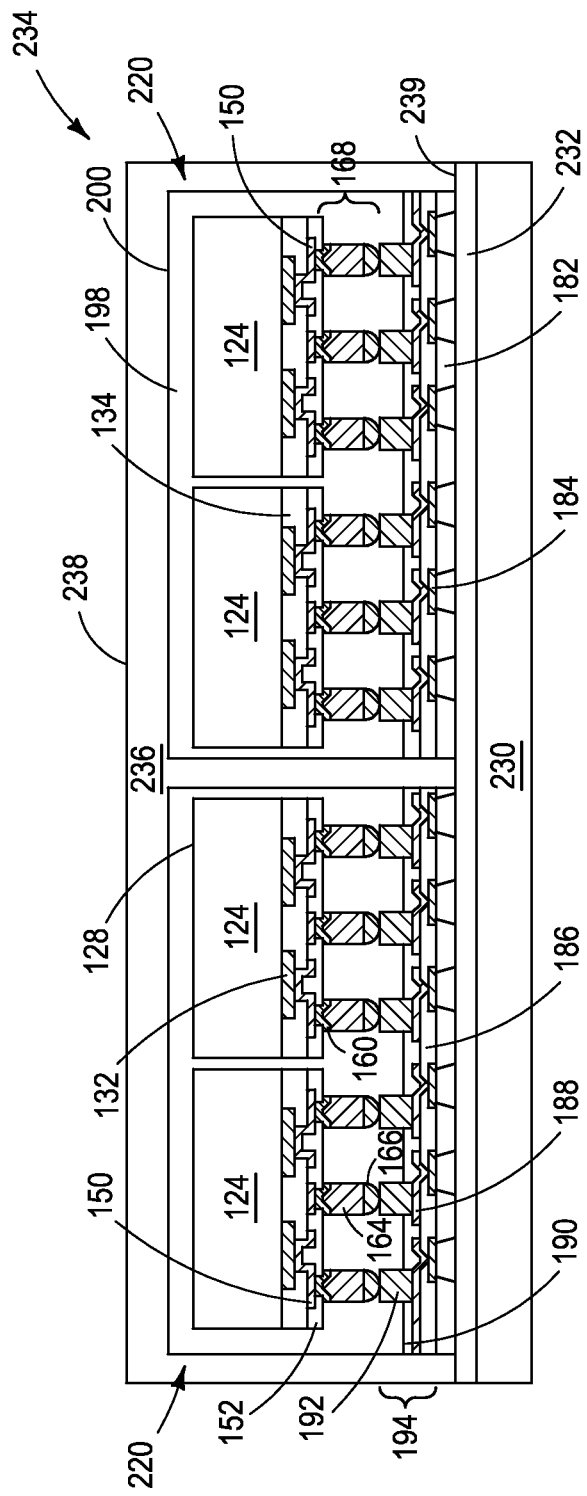
Figure 4O:
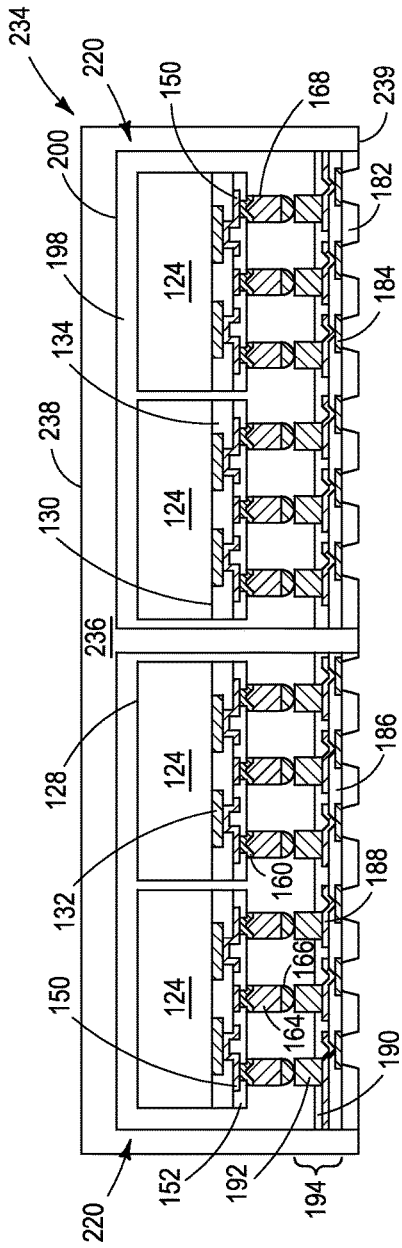
Figure 4P:
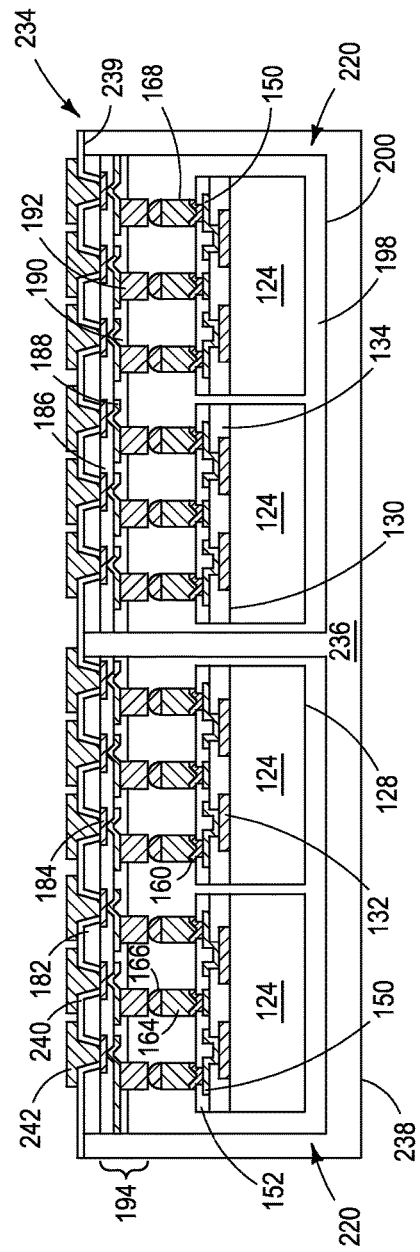
Figure 4S:
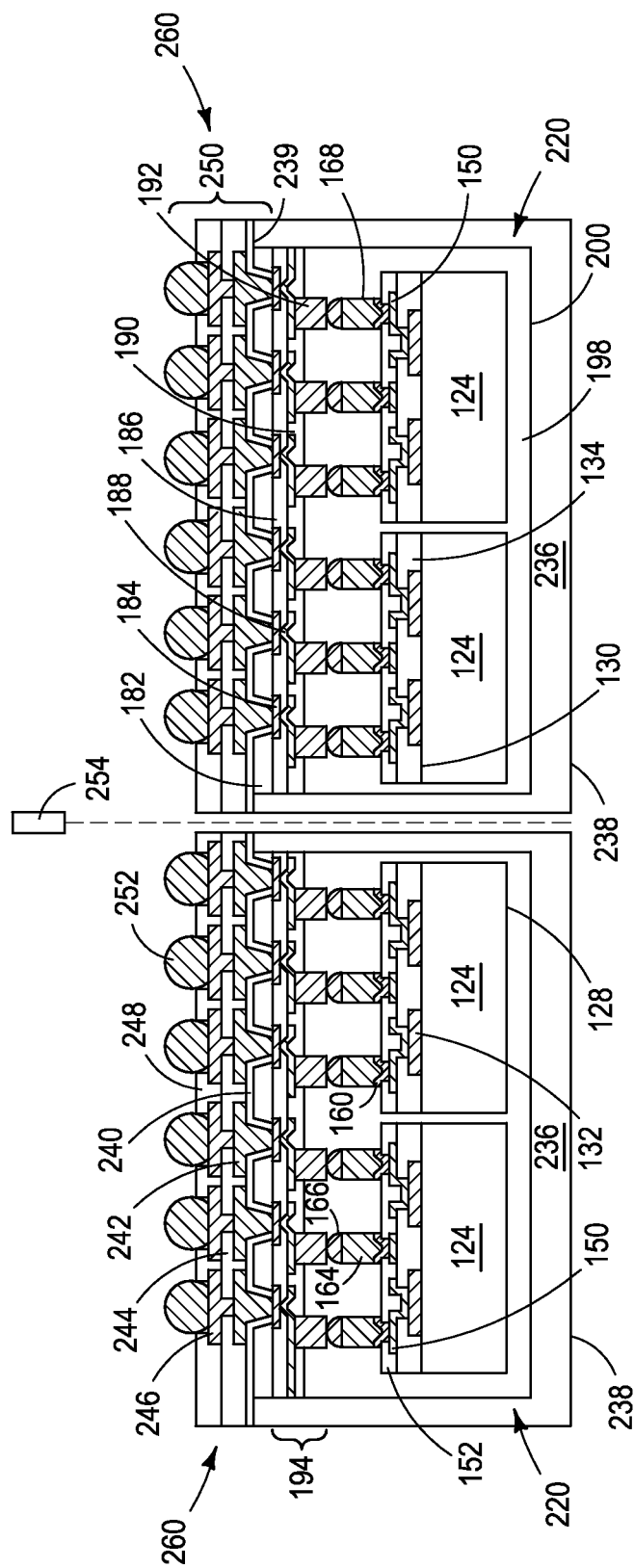

FIGS. 4a-4s illustrate, in relation to FIGS. 1 and 2a-2c, a process of forming a semiconductor device including fine pitched RDL and a build-up interconnect structure. FIG. 4a shows a cross-sectional view of a portion of a carrier or temporary substrate 180 containing sacrificial base material such as silicon, polymer, beryllium oxide, glass, or other suitable low-cost, rigid material for structural support.

An insulating or passivation layer 182 is formed over substrate 180 using PVD, CVD, printing, spin coating, spray coating, sintering, or thermal oxidation. Insulating layer 182 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. Insulating layer 182 is chosen to have good selectivity as a silicon etchant and can act as an etch stop during later removal of substrate 180.

An electrically conductive layer or RDL 184 is formed over insulating layer 182 using PVD, CVD, electrolytic plating, electroless plating process, or other suitable metal deposition process. Conductive layer 184 can be one or more layers of Al, Ti, TiW, Cu, Sn, Ni, Au, Ag, or other electrically conductive material. Portions of conductive layer 184 can be electrically common or electrically isolated depending on the design and function of later mounted semiconductor die. Conductive layer 184 includes a plurality of conductive traces. The conductive traces of conductive layer 184 are formed with fine or narrow pitch. For example, in one embodiment, the conductive traces of conductive layer 184 have a pitch of 2 μm.

An insulating or passivation layer 186 is formed over insulating layer 182 and conductive layer 184 using PVD, CVD, printing, spin coating, spray coating, sintering, or thermal oxidation. Insulating layer 186 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. A portion of insulating layer 186 is removed by LDA, etching, or other suitable process to expose conductive layer 184.

In FIG. 4b, an electrically conductive layer or RDL 188 is conformally deposited over insulating layer 186 and conductive layer 184 using a PVD, CVD, electrolytic plating, or electroless plating process. Conductive layer 188 can be one or more layers of Al, Cu, Sn, Ni, Au, Ag, Ti, W, TiW/Cu, Ti/Cu, or other suitable electrically conductive material. One portion of conductive layer 188 is electrically connected to conductive layer 184. Other portions of conductive layer 188 can be electrically common or electrically isolated depending on the design and function of later mounted semiconductor die. Conductive layer 188 includes a plurality of conductive traces. The conductive traces of conductive layer 188 are formed with a fine or narrow pitch. In one embodiment, the conductive traces of conductive layer 188 are formed with a pitch of 2 μm.

In FIG. 4c, an insulating or passivation layer 190 is formed over insulating layer 186 and conductive layer 188 using PVD, CVD, printing, spin coating, spray coating, lamination, sintering, or thermal oxidation. Insulating layer 190 includes one or more layers of Si3N4, SiO2, SiON, PI, BCB, PBO, WPR, epoxy, low temperature (less than 250° C.) curing polymer dielectric materials, or other material having similar insulating and structural properties. In one embodiment, insulating layer 190 is a solder resist layer. A portion of insulating layer 190 is removed by etching, LDA, or other suitable process to expose conductive layer 188.

In FIG. 4d, an electrically conductive bump material is deposited over conductive layer 188 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 188 using a suitable attachment or bonding process. In one embodiment, the bump material is reflowed by heating the material above the material's melting point to form bumps 192. In some applications, bumps 192 are reflowed a second time to improve electrical contact to conductive layer 188. In one embodiment, bumps 192 are formed over a UBM layer. Bumps 192 can also be compression bonded or thermocompression bonded to conductive layer 188. Bumps 192 represent one type of interconnect structure that can be formed over conductive layer 188. The interconnect structure can also use bond wires, conductive paste, stud bump, micro bump, or other electrical interconnect.

Insulating layer 182, conductive layer 184, insulating layer 186, conductive layer 188, insulating layer 190, and bumps 192 constitute a wafer level redistribution layer (WL RDL) or build-up interconnect structure 194. WL RDL 194 may include an IPD, such as a capacitor, inductor, or resistor.

The conductive traces within WL RDL 194 are formed with fine pitch, e.g., a pitch of 2 µm, and are scalable to a submicron dimension, i.e., in a nanometer range. The narrow pitch of the conductive traces in WL RDL 194 allows for a higher density, i.e., greater number, of conductive traces to be formed within WL RDL 194. The increased number of conductive traces increases the number of interconnection sites and input/output (I/O) terminal count of WL RDL 194. Semiconductor die that require an increased I/O can be mounted to WL RDL 194. Additionally, semiconductor die of differing I/O requirement and/or die from multiple manufactures can be disposed over WL RDL 194.

In FIG. 4e, semiconductor die 124, from FIG. 3i, are disposed over WL RDL 194. Interconnect structures 168 of semiconductor die 124 are aligned with bumps 192. Semiconductor die 124 are mounted to WL RDL 194 using a pick-and-place or other suitable operation. Semiconductor die 124 are KGD having been tested prior to mounting semiconductor die 124 to WL RDL 194.

FIG. 4f shows semiconductor die 124 mounted to WL RDL 194 to form a reconstituted wafer 196. Bump caps 166 are reflowed to metallurgically and electrically connect semiconductor die 124 to WL RDL 194. In some applications, bump caps 166 are reflowed a second time to improve electrical contact to bumps 192. Interconnect structures 168 can also be compression bonded or thermocompression bonded to bumps 192. WL RDL 194 routes electrical signals between semiconductor die 124 according to the design and function of semiconductor die 124.

In FIG. 4g, an encapsulant or molding compound 198 is deposited over semiconductor die 124 and WL RDL 194 using a paste printing, compressive molding, transfer molding, liquid encapsulant molding, vacuum lamination, or other suitable applicator. Encapsulant 198 can be polymer composite material, such as epoxy resin with filler, epoxy acrylate with filler, or polymer with proper filler. Encapsulant 198 is non-conductive, provides physical support, and environmentally protects the semiconductor device from external elements and contaminants. Encapsulant 198 also protects semiconductor die 124 from degradation due to exposure to light. In one embodiment, a portion of encapsulant 198 is removed from surface 200 of encapsulant 198 in a subsequent backgrinding step. The backgrinding operation planarizes the surface of encapsulant 198 and reduces an overall thickness of reconstituted wafer 196.

As shown in FIG. 4g, encapsulant 198 flows between semiconductor die 124 and WL RDL 194, and around interconnect structures 168. In one embodiment, an underfill material 202, such as epoxy resin, is deposited between semiconductor die 124 and WL RDL 194, as shown in FIG. 4h. Underfill material 202 can be deposited by a capillary underfill process. Alternatively, a non-conductive paste or non-conductive film can be applied to WL RDL 194 prior to attaching semiconductor die 124.

Continuing from FIG. 4g, carrier 180 is removed by chemical etching, mechanical peeling, CMP, mechanical grinding, thermal bake, UV light, laser scanning, or wet stripping. Removing carrier 180 leaves WL RDL 194 attached to semiconductor die 124 and exposes insulating layer 182, as shown in FIG. 4i.

In FIG. 4j, a portion of insulating layer 182 is removed by LDA using laser 206 to expose conductive layer 184. Alternatively, a portion of insulating layer 182 is removed by an exposure and development process, by etching, or other suitable process to expose conductive layer 184.

In one embodiment, a portion of carrier 180 is removed by chemical etching, mechanical peeling, CMP, mechanical grinding, thermal bake, UV light, laser scanning, or wet stripping, and a thin layer of carrier 180 is left remaining over insulating layer 182, as shown in FIG. 4k. A portion of the remaining thin layer of carrier 180 and a portion of insulating layer 182 are then removed by LDA using laser 206 to expose conductive layer 184.

Continuing from FIG. 4j, a dicing tape or support carrier 208 is applied over insulating layer 182, as shown in FIG. 4l. Reconstituted wafer 196 is then singulated through encapsulant 198 and WL RDL 194 using a saw blade or laser cutting tool 210 into individual wafer level chip scale packages (WLCSP) 220 including semiconductor die 124 and fine pitch WL RDL 194. Dicing tape 208 supports reconstituted wafer 196 during singulation.

In FIG. 4m, WLCSP 220 from FIG. 4l are disposed over a carrier or temporary substrate 230 containing sacrificial base material such as silicon, polymer, beryllium oxide, glass, or other suitable low-cost, rigid material for structural support. An interface layer or double-sided tape 232 is formed over carrier 230 as a temporary adhesive bonding film, etch-stop layer, or thermal release layer.

Carrier 230 can be a round or rectangular panel (greater than 300 mm) with capacity for multiple WLCSP 220. Carrier 230 may have a larger surface area than the surface area of semiconductor wafer 120 and/or reconstituted wafer 196. A larger carrier reduces the manufacturing cost of the semiconductor package as more semiconductor die/packages can be processed on the larger carrier thereby reducing the cost per unit. Semiconductor packaging and processing equipment are designed and configured for the size of the wafer or carrier being processed.

To further reduce manufacturing costs, the size of carrier 230 is selected independent of the size of semiconductor die 124 and WLCSP 220 or the size of wafer 120 and reconstituted wafer 196. That is, carrier 230 has a fixed or standardized size, which can accommodate various size semiconductor die 124 and WLCSP 220 singulated from one or more wafers 120 and reconstituted wafers 196, respectively. In one embodiment, carrier 230 is circular with a diameter of 330 mm. In another embodiment, carrier 230 is rectangular with a width of 560 mm and length of 600 mm. WLCSP 220 are placed over the standardized carrier 230 with WLCSP including semiconductor die 124 that have dimensions of, for example, 10 mm by 10 mm. Alternatively, WLCSP 220 are placed over the same standardized carrier 230 with WLCSP 220 including semiconductor die 124 have dimensions of, for example, 20 mm by 20 mm. Accordingly, standardized carrier 230 can handle any size semiconductor die or WLCSP, which allows subsequent semiconductor processing equipment to be standardized to a common carrier, i.e., independent of die or package size or incoming wafer size. Semiconductor packaging equipment can be designed and configured for a standard carrier using a common set of processing tools, equipment, and bill of materials to process any semiconductor die size from any incoming wafer size. The common or standardized carrier 230 lowers manufacturing costs and capital risk by reducing or eliminating the need for specialized semiconductor processing lines based on die or package size or incoming wafer size. By selecting a predetermined carrier size to use for any size semiconductor die or package from all semiconductor wafer, a flexible manufacturing line can be implemented.

FIG. 4n shows WLCSP 220 mounted to carrier 230 to form a reconstituted wafer 234. An encapsulant or molding compound 236 is deposited over WLCSP 220 and carrier 230 using a paste printing, compressive molding, transfer molding, liquid encapsulant molding, vacuum lamination, or other suitable applicator. Encapsulant 236 can be polymer composite material, such as epoxy resin with filler, epoxy acrylate with filler, or polymer with proper filler. Encapsulant 236 is non-conductive, provides physical support, and environmentally protects the semiconductor device from external elements and contaminants. Encapsulant 236 also protects semiconductor die 124 from degradation due to exposure to light. In one embodiment, a portion of encapsulant 236 is removed from surface 238 of encapsulant 236 in a subsequent backgrinding step. The backgrinding operation planarizes the surface of encapsulant 236 and reduces an overall thickness of the semiconductor device. A surface 239 of encapsulant 236 opposite backside surface 238 is disposed over carrier 230 and interface layer 232 such that surface 239 of encapsulant 236 is coplanar with insulating layer 182 of WLCSP 220.

In FIG. 4o, carrier 230 and interface layer 232 are removed by chemical etching, mechanical peeling, CMP, mechanical grinding, thermal bake, UV light, laser scanning, or wet stripping to expose surface 239 of encapsulant 236 and insulating layer 182 of WLCSP 220.

In FIG. 4p, reconstituted wafer 234 is inverted and an insulating or passivation layer 240 is formed over surface 239 of encapsulant 236 and insulating layer 182 using PVD, CVD, printing, spin coating, spray coating, sintering, or thermal oxidation. Insulating layer 240 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. A portion of insulating layer 240 is removed by LDA, etching, or other suitable process to expose conductive layer 184. In one embodiment, the portion of insulating layer 182 and the portion of insulating layer 240 are removed at the same time, i.e., in a single manufacturing step, to expose conductive layer 184.

An electrically conductive layer or RDL 242 is formed over insulating layer 240 and conductive layer 184 using a PVD, CVD, electrolytic plating, or electroless plating process. Conductive layer 242 can be one or more layers of Al, Cu, Sn, Ni, Au, Ag, Ti, W, TiW/Cu, Ti/Cu, or other suitable electrically conductive material. One portion of conductive layer 242 is electrically connected to conductive layer 184. Other portions of conductive layer 242 can be electrically common or electrically isolated depending on the design and function of semiconductor die 124. Conductive layer 242 includes a plurality of conductive traces. The conductive traces of conductive layer 242 are formed with a wider pitch than the conductive traces within WL RDL 194. In one embodiment, the conductive traces of conductive layer 242 have a pitch of 15 μm or greater.

In FIG. 4q, an insulating or passivation layer 244 is formed over insulating layer 240 and conductive layer 242 using PVD, CVD, printing, spin coating, spray coating, sintering, or thermal oxidation. Insulating layer 244 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. A portion of insulating layer 244 is removed by LDA, etching, or other suitable process to expose conductive layer 242.

An electrically conductive layer or RDL 246 is formed over insulating layer 244 and conductive layer 242 using a PVD, CVD, electrolytic plating, or electroless plating process. Conductive layer 246 can be one or more layers of Al, Cu, Sn, Ni, Au, Ag, Ti, W, TiW/Cu, Ti/Cu, or other suitable electrically conductive material. One portion of conductive layer 246 is electrically connected to conductive layer 242. Other portions of conductive layer 246 can be electrically common or electrically isolated depending on the design and function of semiconductor die 124. Conductive layer 246 includes a plurality of conductive traces. The conductive traces of conductive layer 246 are formed with a wider pitch than the conductive traces of conductive layers 184 and 188 in WL RDL 194. In one embodiment, the conductive traces of conductive layer 242 have a pitch of 15 μm or greater.

In FIG. 4r, an insulating or passivation layer 248 is formed over insulating layer 244 and conductive layer 246 using PVD, CVD, printing, spin coating, spray coating, sintering, or thermal oxidation. Insulating layer 248 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. In one embodiment, insulating layer 248 is a solder resist. A portion of insulating layer 248 is removed by LDA, etching, or other suitable process to expose conductive layer 246.

The combination of insulating layer 240, conductive layer 242, insulating layer 244, conductive layer 246, and insulating layer 248 constitutes a build-up interconnect structure 250 formed over WLCSP 220 and encapsulant 236. The number of insulating and conductive layers included within build-up interconnect structure 250 depends on, and varies with, the complexity of the circuit routing design. Accordingly, build-up interconnect structure 250 can include any number of insulating and conductive layers to facilitate electrical interconnect with respect to semiconductor die 124. The relaxed design rule and larger pitch of the conductive traces within build-up interconnect structure 250 allows for greater flexibility in the materials and manufacturing techniques used in the fabrication of build-up interconnect structure 250 and reduces manufacturing costs.

In FIG. 4s, an electrically conductive bump material is deposited over conductive layer 246 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 246 using a suitable attachment or bonding process. In one embodiment, the bump material is reflowed by heating the material above the material's melting point to form balls or bumps 252. In some applications, bumps 252 are reflowed a second time to improve electrical contact to conductive layer 246. In one embodiment, bumps 252 are formed over a UBM layer. Bumps 252 can also be compression bonded or thermocompression bonded to conductive layer 246. Bumps 252 represent one type of interconnect structure that can be formed over conductive layer 246. The interconnect structure can also use bond wires, conductive paste, stud bump, micro bump, or other electrical interconnect. Laser marking of reconstituted wafer 234 for alignment, singulation, and/or package identification can be performed before or after bump formation.

FIG. 4s further shows reconstituted 234 is singulated through build-up interconnect structure 250 and encapsulant 236 using a saw blade or laser cutting tool 254 into individual semiconductor devices 260 including semiconductor die 124, WL RDL 194, and build-up interconnect structure 250.

Figure 5:
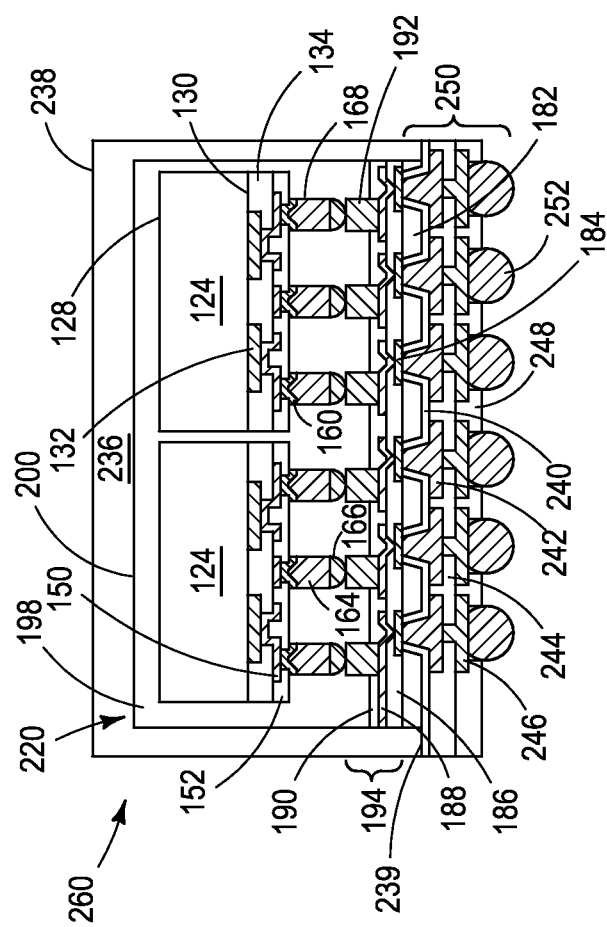
FIG. 5 illustrates a semiconductor device including fine pitch RDL and a build-up interconnect structure.

FIG. 5 shows semiconductor device 260 after singulation. Semiconductor die 124 are electrically connected through WL RDL 194 and build-up interconnect structure 250 to bumps 252 for connection to external devices, for example a PCB. WL RDL 194 routes electrical signals between semiconductor die 124, and between semiconductor die 124 and build-up interconnect structure 250. Build-up interconnect structure 250 routes electrical signals between WLCSP 220 and external devices. Forming two separate build-up interconnect structures, i.e., WL RDL 194 and build-up interconnect structure 250, allows the WL RDL 194 to utilize narrow pitch RDL fabrication techniques to increase I/O and electrical performance of semiconductor device 260, while build-up interconnect structure 250 utilizes standard Fo-eWLB fabrication techniques to minimize cost and provide additional routing to external components. The conductive layers 184 and 188 of WL RDL 194 are formed over temporary substrate 180 prior to attaching semiconductor die 124, providing a cost-effective way to form RDL, with ultra-narrow pitch, that are scalable to a submicron dimension, i.e., in a nanometer range. The narrow pitch of the conductive traces within conductive layers 184 and 188 allows for a higher density of interconnects within WL RDL 194. The high density of interconnects provides more flexibility in integration of semiconductor devices and accommodates semiconductor die with varying bump pitch, for example, semiconductor die from multiple manufacturing sources. Additionally, the narrow pitch of the conductive traces reduces the size of WL RDL 194 and shortens an interconnect distance, i.e., the distance an electrical signal must travel, between semiconductor die 124 and bumps 252. Shorter interconnect distance increases the speed and electrical performance of semiconductor device 260.

WL RDL 194 and build-up interconnect structure 250 within semiconductor device 260 are formed using processes, which are faster, less expensive, and lower risk than the processes used to form a TSV interposer package. Additionally, providing electrical interconnect without having to incorporate a TSV interposer reduces the dimensions and package profile semiconductor device 260. Forming WLCSP 220 prior to, and independent from, build-up interconnect structure 250 allows the signal routing between semiconductor die 124 and the functionality of WLCSP 220 to be tested prior to mounting WLCSP 220 to substrate 230. Accordingly, only known good WLCSP 220 are incorporated into semiconductor device 260. Using only known good WLCSP 220 to fabricate semiconductor device 260, prevents manufacturing time and materials from being wasted making a defective package and thus the yield of semiconductor device 260 is increased and overall cost is reduced.

Build-up interconnect structure 250 provides additional conductive layers within semiconductor device 260. The additional conductive layers may be used for connection to other internal or external devices. Conductive layers 242 and 246 of build-up interconnect structure 250 are formed with relaxed design rules using standard Fo-eWLB processes. Relaxing the design rules of build-up interconnect structure 250 allows for greater flexibility in the materials and manufacturing techniques used in the fabrication of build-up interconnect structure 250. For example, build-up interconnect structure 250 can be formed using standard Fo-eWLB equipment and materials, as opposed to materials specific to fabricating conductive layers with ultra-narrow pitch. The use of standardized equipment and materials reduces the manufacturing time and cost of semiconductor device 260. The wider pitch of the conductive traces within build-up interconnect structure 250 also provides greater flexibility in the placement and pitch of bumps 252. The pitch of bumps 252 can be selected to mirror industry standards. For example, bumps 252 can be formed with the same pitch as the interconnection pads on a standard PCB. In one embodiment, bumps 252 have a pitch of 0.4 mm. Relaxing the design rule of bumps 252 increases the compatibility of semiconductor device 260 with external devices and eliminates the need for an additional substrate or interposer.

Forming fine pitch WL RDL 194 on sacrificial substrate 180, transferring WL RDL 194 to semiconductor die 124 by chip-to-wafer molding, and forming build-up interconnect structure 250 over WLCSP 220 using standard Fo-eWLB fabrication processes allows semiconductor device 260 to incorporate semiconductor die with high and/or differing I/O requirements while minimizing the size, manufacturing time, and cost of semiconductor device 260.

Figure 6E:
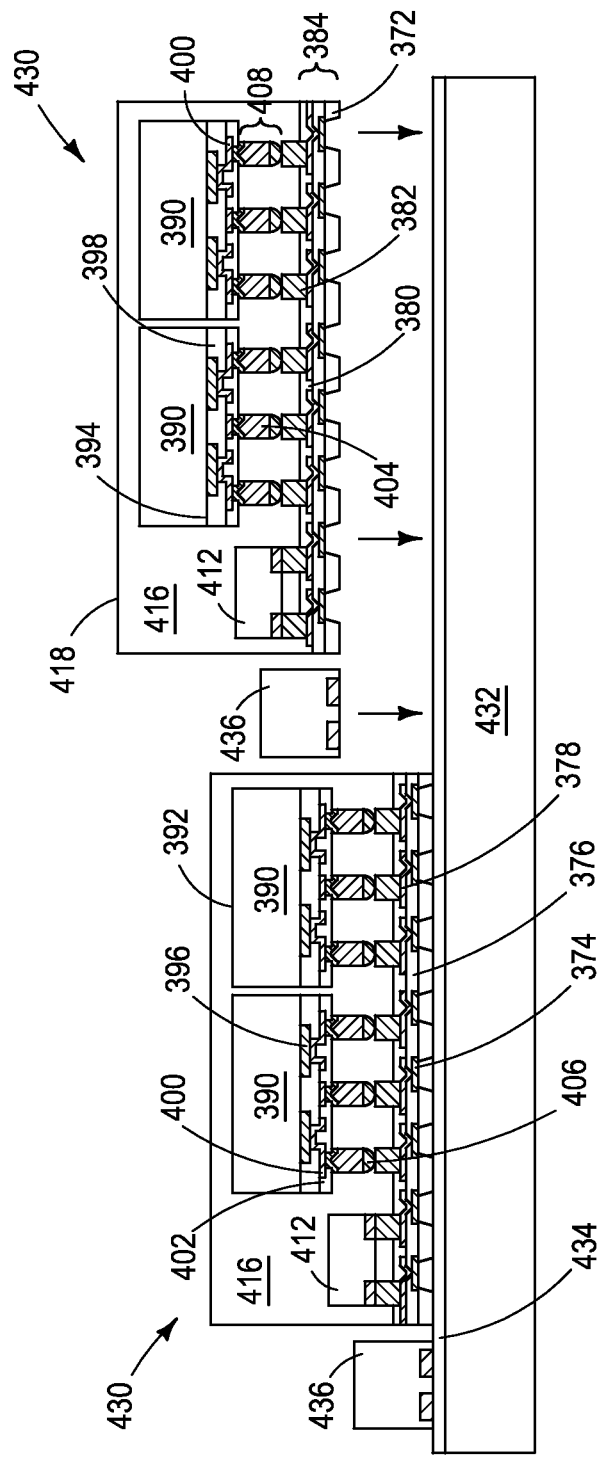

FIGS. 6*a*-6*i* illustrate, in relation to FIGS. 1 and 2*a*-2*c*, a process of forming a semiconductor device including fine pitch RDL and embedded passive devices. FIG. 6*a* shows a WL RDL or build-up interconnect structure 384, similar to WL RDL 194 in FIG. 4*d*, formed over a carrier or temporary substrate 370. Substrate 370 contains a sacrificial base material such as silicon, polymer, beryllium oxide, glass, or other suitable low-cost, rigid material for structural support. WL RDL 384 includes insulating layer 372, conductive layer 374, insulating layer 376, conductive layer 378, insulating layer 380, and bumps 382.

Insulating or passivation layer 372 is formed over substrate 370 using PVD, CVD, printing, spin coating, spray coating, sintering, or thermal oxidation. Insulating layer 372 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. Insulating layer 372 is chosen to have good selectivity as a silicon etchant and can act as an etch stop during later removal of substrate 370.

Electrically conductive layer or RDL 374 is formed over insulating layer 372 using PVD, CVD, electrolytic plating, electroless plating process, or other suitable metal deposition process. Conductive layer 374 can be one or more layers of Al, Ti, TiW, Cu, Sn, Ni, Au, Ag, or other electrically conductive material. Portions of conductive layer 374 can be electrically common or electrically isolated depending on the design and function of later mounted semiconductor die. Conductive layer 374 includes a plurality of conductive traces. The conductive traces of conductive layer 374 are formed with fine pitch. For example, in one embodiment, the conductive traces of conductive layer 374 have a pitch of 2 μm.

Insulating or passivation layer 376 is formed over insulating layer 372 and conductive layer 374 using PVD, CVD, printing, spin coating, spray coating, sintering, or thermal oxidation. Insulating layer 376 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. A portion of insulating layer 376 is removed by LDA, etching, or other suitable process to expose conductive layer 374.

Electrically conductive layer 378 is conformally deposited over insulating layer 376 and conductive layer 374 using a PVD, CVD, electrolytic plating, or electroless plating process. Conductive layer 378 can be one or more layers of Al, Cu, Sn, Ni, Au, Ag, Ti, W, TiW/Cu, Ti/Cu, or other suitable electrically conductive material. One portion of conductive layer 378 is electrically connected to conductive layer 374. Other portions of conductive layer 378 can be electrically common or electrically isolated depending on the design and function of later mounted semiconductor die. Conductive layer 378 includes a plurality of conductive traces. The conductive traces of conductive layer 378 are formed with fine pitch. For example, in one embodiment, the conductive traces of conductive layer 378 are formed with a pitch of 2 μm.

Insulating or passivation layer 380 is formed over insulating layer 376 and conductive layer 378 using PVD, CVD, printing, spin coating, spray coating, lamination, sintering, or thermal oxidation. Insulating layer 380 includes one or more layers of Si3N4, SiO2, SiON, PI, BCB, PBO, WPR, epoxy, low temperature (less than 250° C.) curing polymer dielectric materials, or other material having similar insulating and structural properties. In one embodiment, insulating layer 380 is a solder resist layer. A portion of insulating layer 380 is removed by etching, LDA, or other suitable process to expose conductive layer 378.

An electrically conductive bump material is deposited over conductive layer 378 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 378 using a suitable attachment or bonding process. In one embodiment, the bump material is reflowed by heating the material above the material's melting point to form bumps 382. In some applications, bumps 382 are reflowed a second time to improve electrical contact to conductive layer 378. In one embodiment, bumps 382 are formed over a UBM layer. Bumps 382 can also be compression bonded or thermocompression bonded to conductive layer 378. Bumps 382 represent one type of interconnect structure that can be formed over conductive layer 378. The interconnect structure can also use bond wires, conductive paste, stud bump, micro bump, or other electrical interconnect.

Insulating layer 372, conductive layer 374, insulating layer 376, conductive layer 378, insulating layer 380, and bumps 382 constitute WL RDL or build-up interconnect structure 384. The conductive traces within WL RDL 384 are formed with fine pitch, e.g., a pitch of 2 μm, and are scalable to a submicron dimension, i.e., in a nanometer range. The narrow pitch of the conductive traces in WL RDL 384 allows for a higher density, i.e., greater number, of conductive traces to be formed within WL RDL 384. The increased number of conductive traces increases the number of interconnection sites and I/O terminal count of WL RDL 384. WL RDL 384 accommodates semiconductor die that require an increased I/O count. Additionally, semiconductor die of differing I/O requirement and/or die from multiple manufactures can be disposed over WL RDL 384.

FIG. 6a further shows semiconductor die 390, similar to semiconductor die 124 from FIG. 3i, disposed over WL RDL 384, and semiconductor components or passive devices 412 disposed over WL RDL 384 in a peripheral region of semiconductor die 390. Semiconductor die 390 and passive devices 412 are disposed over WL RDL using, for example, a pick and place operation. Semiconductor die 390 has a back or non-active surface 392 and an active surface 394, similar to active surface 130 of semiconductor die 124, opposite surface 392. An electrically conductive layer 396, similar to conductive layer 132, is formed over active surface 394. An insulating or passivation layer 398, similar to insulating layer 134, is formed over active surface 394 and conductive layer 396. A portion of insulating layer 398 is removed by LDA, etching, or other suitable process to expose portions of conductive layer 396. An electrically conductive layer or RDL 400, similar to conductive layer 150 of semiconductor die 124, is formed over insulating layer 398. Conductive layer 400 is electrically connected to conductive layer 396. An insulating or passivation layer 402, similar to insulating layer 152, is formed over conductive layer 400 and insulating layer 398. A portion of insulating layer 402 is removed by LDA, etching, or other suitable process to expose portions of conductive layer 400. A conductive layer 403, similar to conductive layer 160, is formed over conductive layer 400 and insulating layer 402. A plurality of interconnect structures 408, similar to interconnect structures 168 of semiconductor die 124, is formed over conductive layer 403. Interconnect structures 408 include a non-fusible portion (conductive pillar 404) and a fusible portion (bumps cap 406). Interconnect structures 408 represent one type of interconnect structure that can be formed over semiconductor die 390. The interconnect structure can also use bond wire, bumps, conductive paste, stud bump, micro bump, or other electrical interconnect.

FIG. 6b shows semiconductor die 390 and passive devices 412 mounted to WL RDL 384 to form a reconstituted wafer 414. Bump caps 406 are reflowed to metallurgically and electrically connect semiconductor die 390 to WL RDL 384. In some applications, bump caps 406 are reflowed a second time to improve electrical contact to bumps 382. Semiconductor die 390 and passive devices 412 are each electrically connected WL RDL 384. In one embodiment, an underfill material, similar to underfill material 202 in FIG. 4h, is disposed between semiconductor die 390 and WL RDL 384.

An encapsulant or molding compound 416 is deposited over semiconductor die 390, passive devices 412, and WL RDL 384 using a paste printing, compressive molding, transfer molding, liquid encapsulant molding, vacuum lamination, or other suitable applicator. Encapsulant 416 can be polymer composite material, such as epoxy resin with filler, epoxy acrylate with filler, or polymer with proper filler. Encapsulant 416 is non-conductive, provides physical support, and environmentally protects the semiconductor device from external elements and contaminants. Encapsulant 416 also protects semiconductor die 390 from degradation due to exposure to light. In one embodiment, a portion of encapsulant 416 is removed from surface 418 of encapsulant 416 in a subsequent backgrinding step. The backgrinding operation planarizes the surface of encapsulant 416 and reduces an overall thickness of reconstituted wafer 414.

In FIG. 6c, substrate 370 is removed by chemical etching, mechanical peeling, CMP, mechanical grinding, thermal bake, UV light, laser scanning, or wet stripping, and a portion of insulating layer 372 is removed by LDA using laser 420 to expose conductive layer 374. Alternatively, the portion of insulating layer 372 is removed by an exposure and development process, etching, or other suitable process to expose conductive layer 374. In one embodiment, a thin layer of substrate 370 is left over insulating layer 372, similar to substrate 180 in FIG. 4k.

In FIG. 6d, a dicing tape or support carrier 422 is applied over insulating layer 372. Reconstituted wafer 414 is then singulated through encapsulant 416 and WL RDL 384 using a saw blade or laser cutting tool 424 into individual WLCSP 430 including semiconductor die 124, passive device 412, and fine pitch WL RDL 384. Dicing tape 422 supports reconstituted wafer 414 during singulation.

In FIG. 6e, WLCSP 430 from FIG. 6d are disposed over a carrier or temporary substrate 432 containing sacrificial base material such as silicon, polymer, beryllium oxide, glass, or other suitable low-cost, rigid material for structural support. An interface layer or double-sided tape 434 is formed over carrier 432 as a temporary adhesive bonding film, etch-stop layer, or thermal release layer.

A semiconductor component or passive device 436 is disposed over carrier 432 and interface layer 434 adjacent to WLCSP 430. In one embodiment, passive device 412 of WLCSP 430 is a smaller passive device, for example a 01005 (metric code 0402) or a 0201 (metric code 0603) size passive component, and passive device 436 is a larger passive device, for example a 0402 (metric code 1005) or a 0603 (metric code 1608) size passive component.

Figure 6F:
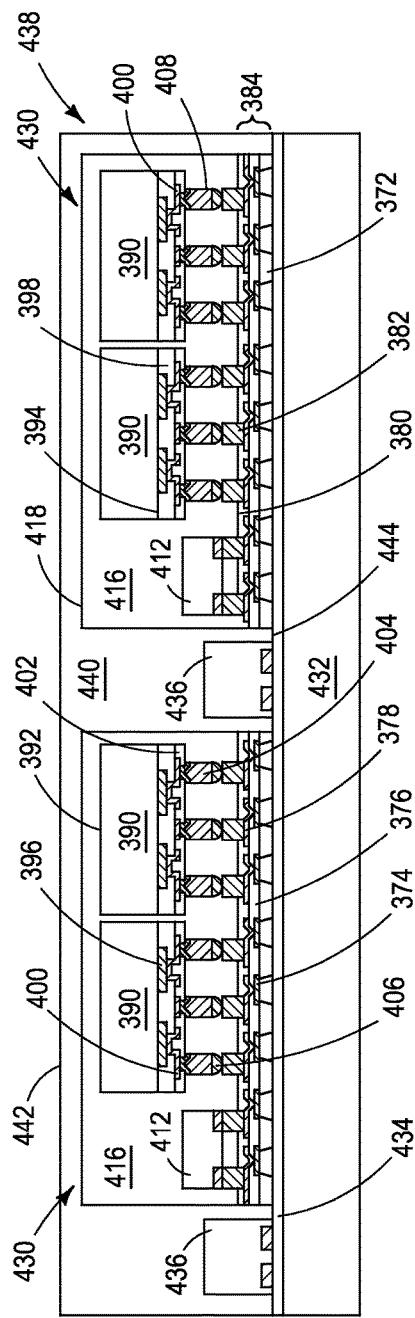

FIG. 6f shows WLCSP 430 and passive devices 436 mounted to carrier 432 to form a reconstituted wafer 438. An encapsulant or molding compound 440 is deposited over WLCSP 430, passive devices 436, and carrier 432 using a paste printing, compressive molding, transfer molding, liquid encapsulant molding, vacuum lamination, or other suitable applicator. Encapsulant 440 can be polymer composite material, such as epoxy resin with filler, epoxy acrylate with filler, or polymer with proper filler. Encapsulant 440 is non-conductive, provides physical support, and environmentally protects the semiconductor device from external elements and contaminants. Encapsulant 440 also protects semiconductor die 390 from degradation due to exposure to light. In one embodiment, a portion of encapsulant 440 is removed from surface 442 of encapsulant 440 in a subsequent backgrinding step. The backgrinding operation planarizes the surface of encapsulant 440 and reduces an overall thickness of the semiconductor device. A surface 444 of encapsulant 440 opposite backside surface 442 is disposed over carrier 432 and interface layer 434 such that surface 444 of encapsulant 440 is coplanar with insulating layer 372 of WLCSP 430.

Figure 6G:
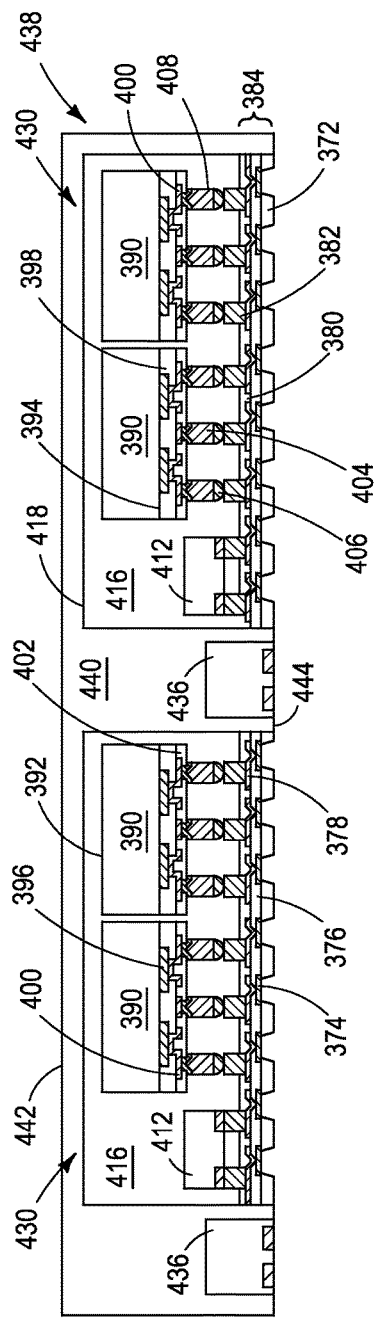

In FIG. 6g, carrier 432 and interface layer 434 are removed by chemical etching, mechanical peeling, CMP, mechanical grinding, thermal bake, UV light, laser scanning, or wet stripping. Removing carrier 432 and interface layer 434 exposes surface 444 of encapsulant 440, insulating layer 372 of WLCSP 430, and passive devices 436.

Figure 6H:
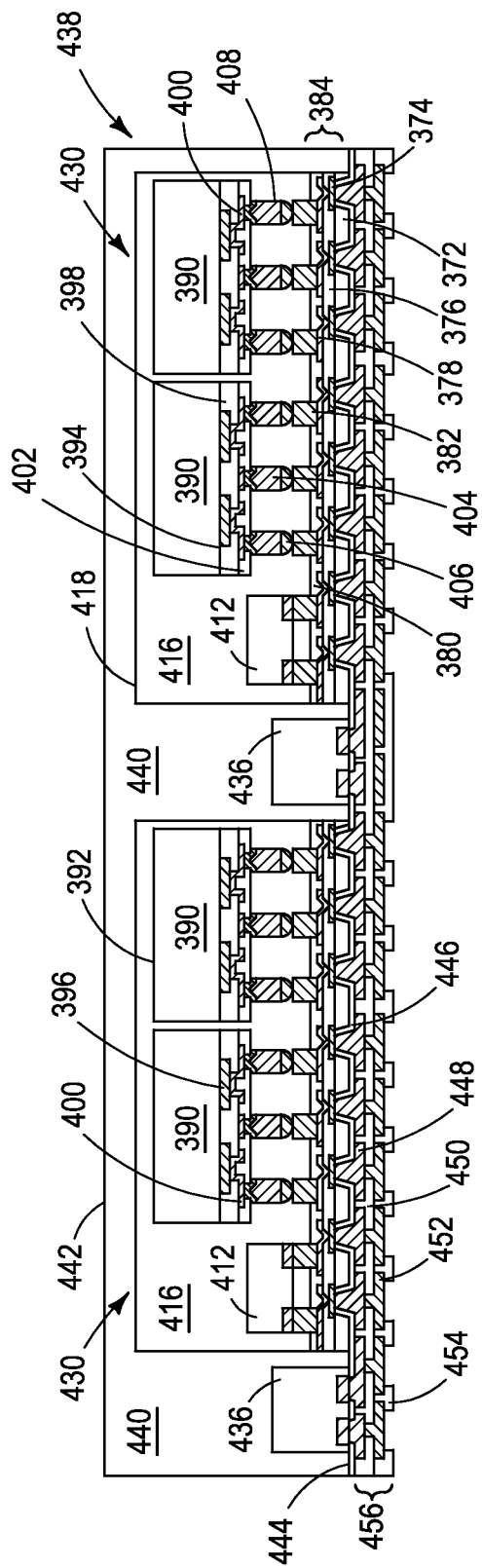

In FIG. 6h, a build-up interconnect structure 456 is formed over surface 444 of encapsulant 440, WLCSP 430, and passive devices 436. Build-up interconnect structure 456 includes an insulating layer 446, conductive layer 448, insulating layer 450, conductive layer 452, and insulating layer 454.

Insulating or passivation layer 446 is formed over surface 444 of encapsulant 440, insulating layer 372, and passive device 436 using PVD, CVD, printing, spin coating, spray coating, sintering, or thermal oxidation. Insulating layer 446 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. A portion of insulating layer 446 is removed by LDA, etching, or other suitable process to expose conductive layer 374 and passive device 436. In one embodiment, the portion of insulating layer 372 and the portion of insulating layer 446 are removed at the same time, i.e., in a single manufacturing step, to expose conductive layer 374 and passive device 436.

Electrically conductive layer or RDL 448 is formed over insulating layer 446 using a PVD, CVD, electrolytic plating, or electroless plating process. Conductive layer 448 can be one or more layers of Al, Cu, Sn, Ni, Au, Ag, Ti, W, TiW/Cu, Ti/Cu, or other suitable electrically conductive material. One portion of conductive layer 448 is electrically connected to conductive layer 374. One portion of conductive layer 448 is electrically connected to passive device 436. Other portions of conductive layer 448 can be electrically common or electrically isolated depending on the design and function of semiconductor die 390. Conductive layer 448 includes a plurality of conductive traces. The conductive traces of conductive layer 448 are formed with relaxed design rules and a wider pitch than the conductive traces within WL RDL 384. In one embodiment, the conductive traces of conductive layer 448 have a pitch of 15 µm or greater.

Insulating or passivation layer 450 is formed over insulating layer 446 and conductive layer 448 using PVD, CVD, printing, spin coating, spray coating, sintering, or thermal oxidation. Insulating layer 450 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. A portion of insulating layer 450 is removed by LDA, etching, or other suitable process to expose conductive layer 448.

Electrically conductive layer or RDL 452 is formed over insulating layer 450 and conductive layer 448 using a PVD, CVD, electrolytic plating, or electroless plating process. Conductive layer 452 can be one or more layers of Al, Cu, Sn, Ni, Au, Ag, Ti, W, TiW/Cu, Ti/Cu, or other suitable electrically conductive material. One portion of conductive layer 452 is electrically connected to conductive layer 448. Other portions of conductive layer 452 can be electrically common or electrically isolated depending on the design and function of semiconductor die 390. Conductive layer 452 includes a plurality of conductive traces. The conductive traces of conductive layer 452 are formed with a wider pitch than the conductive traces of conductive layers 374 and 378 in WL RDL 384. In one embodiment, the conductive traces of conductive layer 452 have a pitch of 15 µm or greater.

Insulating or passivation layer 454 is formed over insulating layer 450 and conductive layer 452 using PVD, CVD, printing, spin coating, spray coating, sintering, or thermal oxidation. Insulating layer 454 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. In one embodiment, insulating layer 454 is a solder resist. A portion of insulating layer 454 is removed by LDA, etching, or other suitable process to expose conductive layer 452.

The combination of insulating layer 446, conductive layer 448, insulating layer 450, conductive layer 452, and insulating layer 454 constitutes a build-up interconnect structure 456 formed over WLCSP 430, passive device 436, and encapsulant 440. The number of insulating and conductive layers included within build-up interconnect structure 456 depends on, and varies with, the complexity of the circuit routing design. Accordingly, build-up interconnect structure 456 can include any number of insulating and conductive layers to facilitate electrical interconnect with respect to semiconductor die 390. The larger pitch and relaxed design rule of the conductive traces within build-up interconnect structure 456 allows for greater flexibility in the materials and manufacturing techniques used in the fabrication of build-up interconnect structure 456 and reduces manufacturing cost.

Figure 6I:
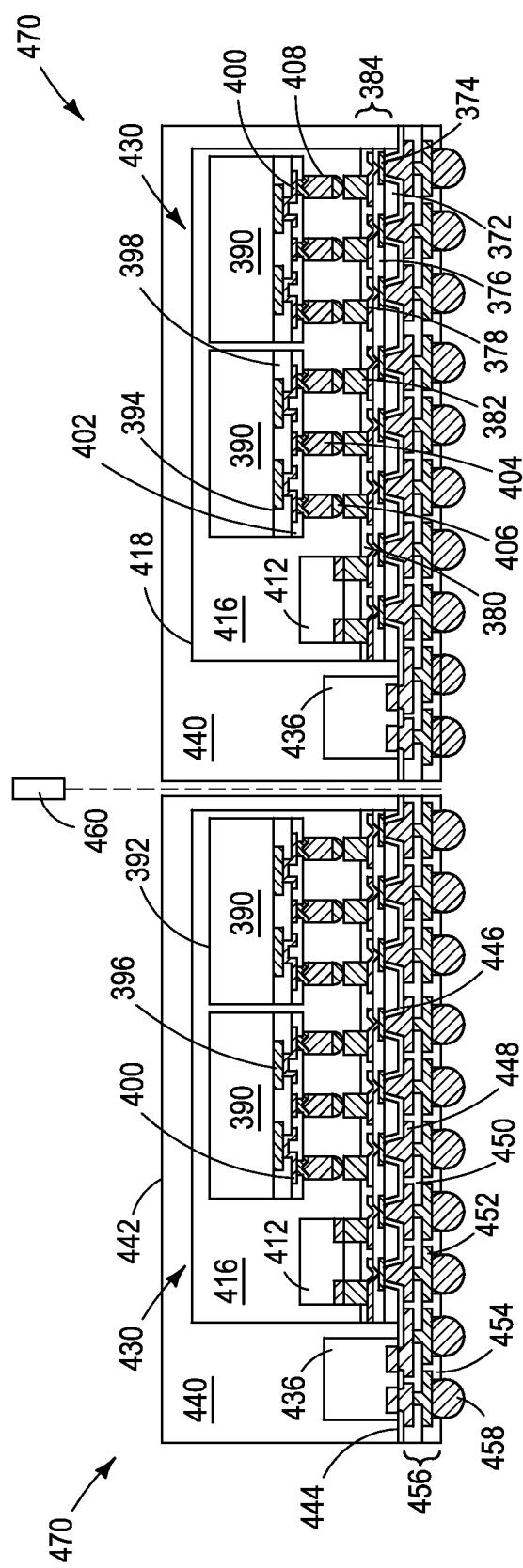

In FIG. 6i, an electrically conductive bump material is deposited over conductive layer 452 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 452 using a suitable attachment or bonding process. In one embodiment, the bump material is reflowed by heating the material above the material's melting point to form balls or bumps 458. In some applications, bumps 458 are reflowed a second time to improve electrical contact to conductive layer 452. In one embodiment, bumps 458 are formed over a UBM layer. Bumps 458 can also be compression bonded or thermocompression bonded to conductive layer 452. Bumps 458 represent one type of interconnect structure that can be formed over conductive layer 452. The interconnect structure can also use bond wires, conductive paste, stud bump, micro bump, or other electrical interconnect. Laser marking of reconstituted wafer 438 for alignment, singulation, and/or package identification can be performed before or after bump formation.

FIG. 6i further shows reconstituted wafer 438 is singulated through build-up interconnect structure 456 and encapsulant 440 using a saw blade or laser cutting tool 460 into individual semiconductor devices 470 including WLCSP 430, passive device 436, and build-up interconnect structure 456.

Figure 7:
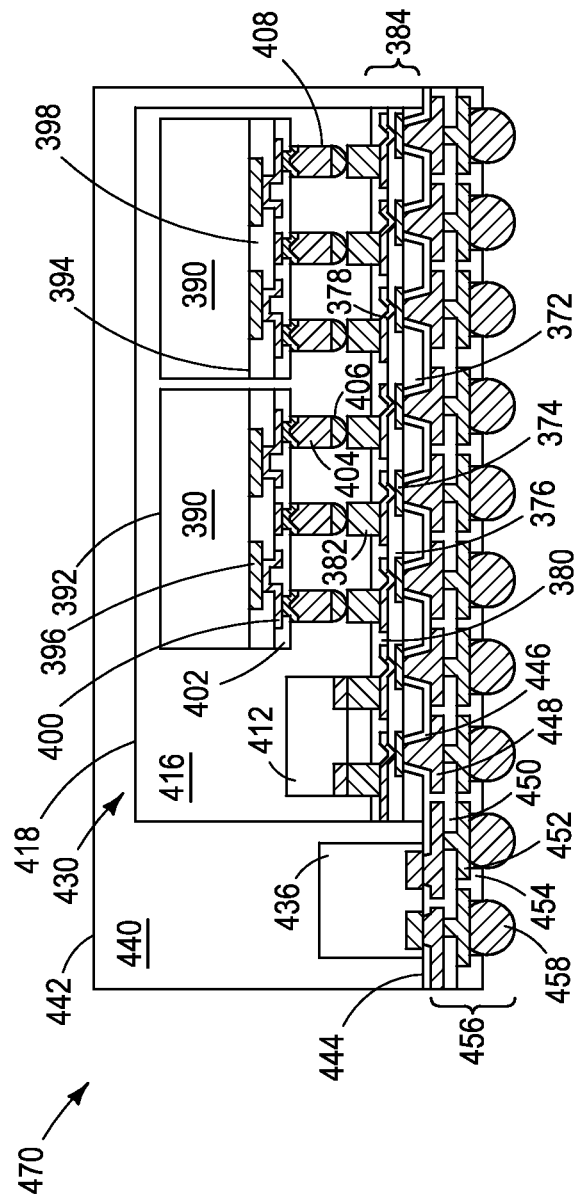
FIG. 7 illustrates a semiconductor device including fine pitch RDL and embedded passive devices.

FIG. 7 shows semiconductor device 470 after singulation. Semiconductor die 390 are electrically connected through WL RDL 384 and build-up interconnect structure 456 to bumps 458 for connection to external devices. WL RDL 384 routes electrical signals between semiconductor die 390, and between semiconductor die 390 and passive device 412. Build-up interconnect structure 456 routes electrical signals between WLCSP 430, passive device 436, and external devices, for example a PCB. Forming two separate build-up interconnect structures, i.e., WL RDL 384 and build-up interconnect structure 456, allows the WL RDL 384 to utilize narrow pitch RDL fabrication techniques to increase I/O and electrical performance of semiconductor device 470, while build-up interconnect structure 456 utilizes standard Fo-eWLB fabrication techniques to minimize cost and provide additional routing to external components. The conductive layers 374 and 378 of WL RDL 384 are formed over temporary substrate 370 prior to attaching semiconductor die 390, providing a cost-effective way to form RDL, with ultra-narrow pitch, that are scalable to a submicron dimension, i.e., in a nanometer range. The narrow pitch of the conductive traces within conductive layers 374 and 378 allows for a higher density of interconnects within WL RDL 384. The high density of interconnects provides more flexibility in integration of semiconductor devices and accommodates semiconductor die with varying bump pitch, for example, semiconductor die from multiple manufacturing sources. Additionally, the narrow pitch of the conductive traces reduces the size of WL RDL 384 and shortens an interconnect distance, i.e., the distance an electrical signal must travel, between semiconductor die 390 and bumps 458. Shorter interconnect distance increases the speed and electrical performance of semiconductor device 470.

WL RDL 384 and build-up interconnect structure 456 within semiconductor device 470 are formed using processes, which are faster, less expensive, and lower risk than the processes used to form a TSV interposer package. Additionally, providing electrical interconnect without having to incorporate a TSV interposer reduces the dimensions and package profile semiconductor device 470. Forming WLCSP 430 prior to, and independent from, build-up interconnect structure 456 allows the signal routing between semiconductor die 390 and the functionality of WLCSP 430 to be tested prior to mounting WLCSP 430 to carrier 432. Accordingly, only known good WLCSP 430 are incorporated into semiconductor device 470. Using only known good WLCSP 430 to fabricate semiconductor device 470, prevents manufacturing time and materials from being wasted making a defective package and thus the yield of semiconductor device 470 is increased and overall cost is reduced.

Build-up interconnect structure 456 provides additional conductive layers within semiconductor device 470, which may be used for connection to other internal, for example passive device 436, or external devices. Embedding passive devices 436 and 412 within semiconductor device 470 increases the functionality and electrical performance of semiconductor device 470 without increasing package profile. Conductive layers 448 and 452 of build-up interconnect structure 456 are formed with relaxed design rules using standard Fo-eWLB processes. Relaxing the design rules of build-up interconnect structure 456 allows for greater flexibility in the materials and manufacturing techniques used in the fabrication of build-up interconnect structure 456. For example, build-up interconnect structure 456 can be formed using standard Fo-eWLB equipment and materials, as opposed to materials specific to fabricating conductive layers with ultra-narrow pitch. The use of standardized equipment and materials reduces the manufacturing time and cost of semiconductor device 470. The wider pitch of the conductive traces within build-up interconnect structure 456 also provides greater flexibility in the placement and pitch of bumps 458. The pitch of bumps 458 can be selected to mirror industry standards. For example, bumps 458 can be formed with the same pitch as the interconnection pads on a standard PCB. In one embodiment, bumps 458 have a pitch of 0.4 mm. Relaxing the design rule of bumps 458 increases the compatibility of semiconductor device 470 with external devices and eliminates the need for an additional substrate or interposer.

Forming fine pitch WL RDL 384 on sacrificial substrate 370, transferring WL RDL 384 to semiconductor die 390 by chip-to-wafer molding, and forming build-up interconnect structure 456 over WLCSP 430 using standard Fo-eWLB fabrication processes allows semiconductor device 470 to incorporate semiconductor die with high and/or differing I/O requirements while minimizing the size, manufacturing time, and cost of semiconductor device 470.

Figure 8C:
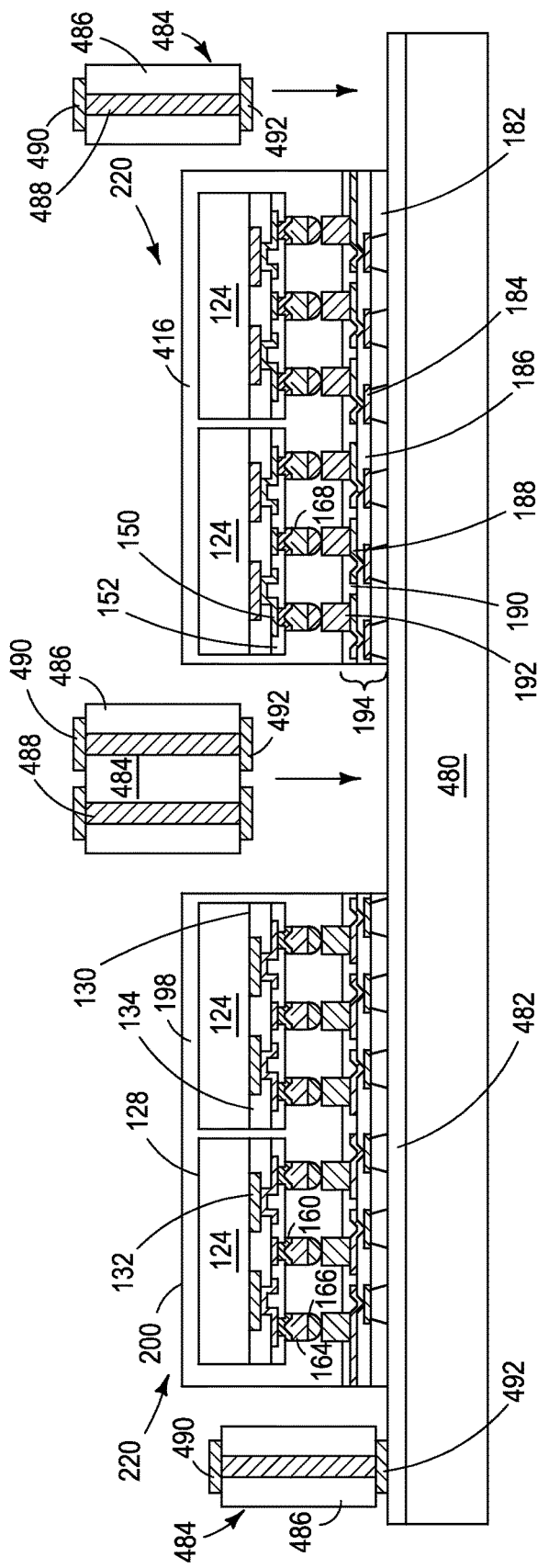

FIGS. 8a-8i illustrate, in relation to FIGS. 1 and 2a-2c, a process of forming a semiconductor device including fine pitch RDL and embedded vertical interconnect units. FIG. 8a shows a cross-sectional view of a portion of a carrier or temporary substrate 480 containing sacrificial base material such as silicon, polymer, beryllium oxide, glass, or other suitable low-cost, rigid material for structural support. An interface layer or double-sided tape 482 is formed over carrier 480 as a temporary adhesive bonding film, etch-stop layer, or thermal release layer.

In FIG. 8b, WLCSP 220, from FIG. 4l, are disposed over carrier 480 and interface layer 482 with insulating layer 182 oriented toward carrier 480. In FIG. 8c, a plurality of PCB modular vertical interconnect units 484 are disposed over carrier 480 and interface layer 482. Vertical interconnect units 484 are disposed around or in a peripheral region of WLCSP 220. Vertical interconnect units 484 may be disposed around WLCSP 220 in an interlocking pattern such that each WLCSP 220 is surrounded by a number of vertical interconnect units 484. In one embodiment, vertical interconnect unit 484 is a single unit or sheet and WLCSP 220 are disposed in openings that are formed or punched through the vertical interconnect unit.

Vertical interconnect units 484 include a core substrate 486. Core substrate 486 includes one or more laminated layers of polytetrafluoroethylene prepreg, FR-4, FR-1, CEM-1, or CEM-3 with a combination of phenolic cotton paper, epoxy, resin, woven glass, matte glass, polyester, glass fabric with filler, and other reinforcement fibers or fabrics. Alternatively, core substrate 486 includes one or more insulating or passivation layers.

A plurality of through vias is formed through core substrate 486 using laser drilling, mechanical drilling, or DRIE. The vias are filled with Al, Cu, Sn, Ni, Au, Ag, Ti, W, or other suitable electrically conductive material using electrolytic plating, electroless plating process, or other suitable deposition process to form z-direction vertical interconnects or conductive vias 488. In one embodiment, Cu is deposited over the sidewall of the through vias by electroless plating and electroplating and the remaining space in the through vias is filled with an insulating or conductive filler material.

An electrically conductive layer or RDL 490 is formed over the surface of core substrate 486 and conductive vias 488 using a patterning and metal deposition process such as printing, PVD, CVD, sputtering, electrolytic plating, and electroless plating. Conductive layer 490 includes one or more layers of Al, Cu, Sn, Ni, Au, Ag, or other suitable electrically conductive material. Conductive layer 490 is electrically connected to conductive vias 488. Conductive layer 490 operates as contact pads electrically connected to conductive vias 488.

An electrically conductive layer or RDL 492 is formed over a surface of core substrate 486 opposite conductive layer 490 using a patterning and metal deposition process such as printing, PVD, CVD, sputtering, electrolytic plating, and electroless plating. Conductive layer 492 includes one or more layers of Al, Cu, Sn, Ni, Au, Ag, or other suitable electrically conductive material. Conductive layer 492 is electrically connected to conductive vias 488 and conductive layer 490. Conductive layer 492 operates as contact pads electrically connected to conductive vias 488. Alternatively, conductive vias 488 are formed through core substrate 486 after forming conductive layer 490 and/or conductive layer 492.

Figure 8D:
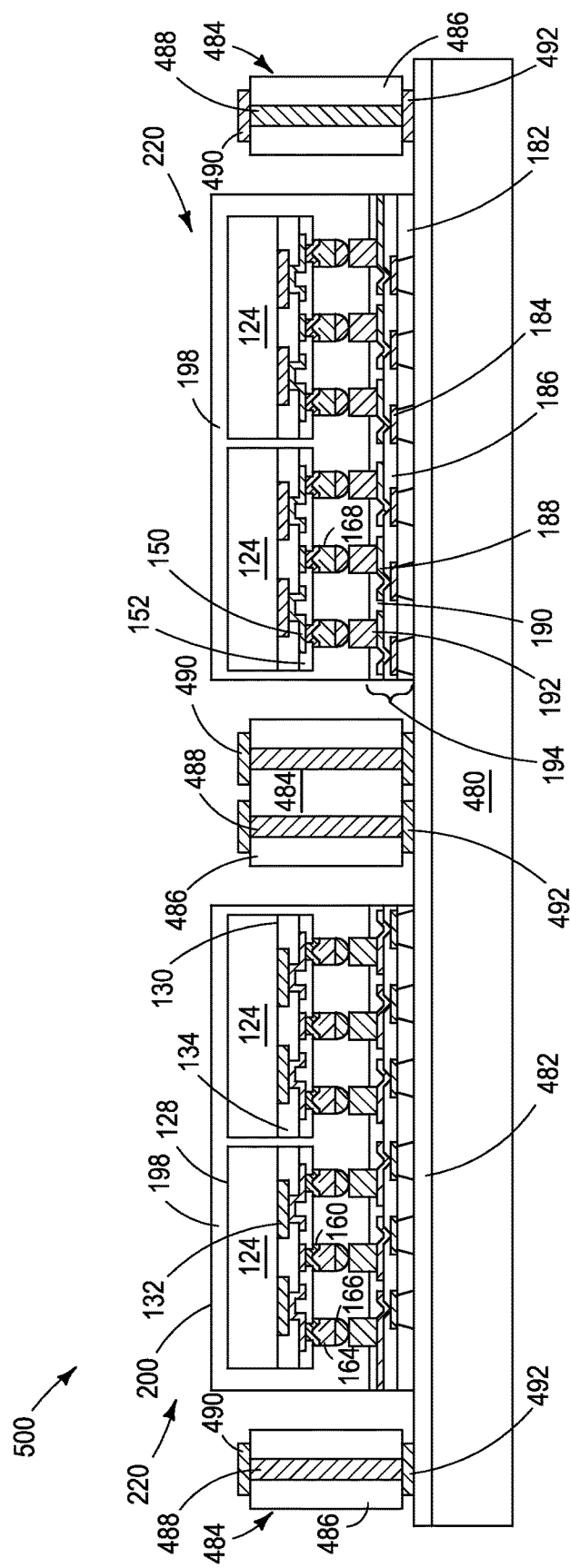
Figure 8E:
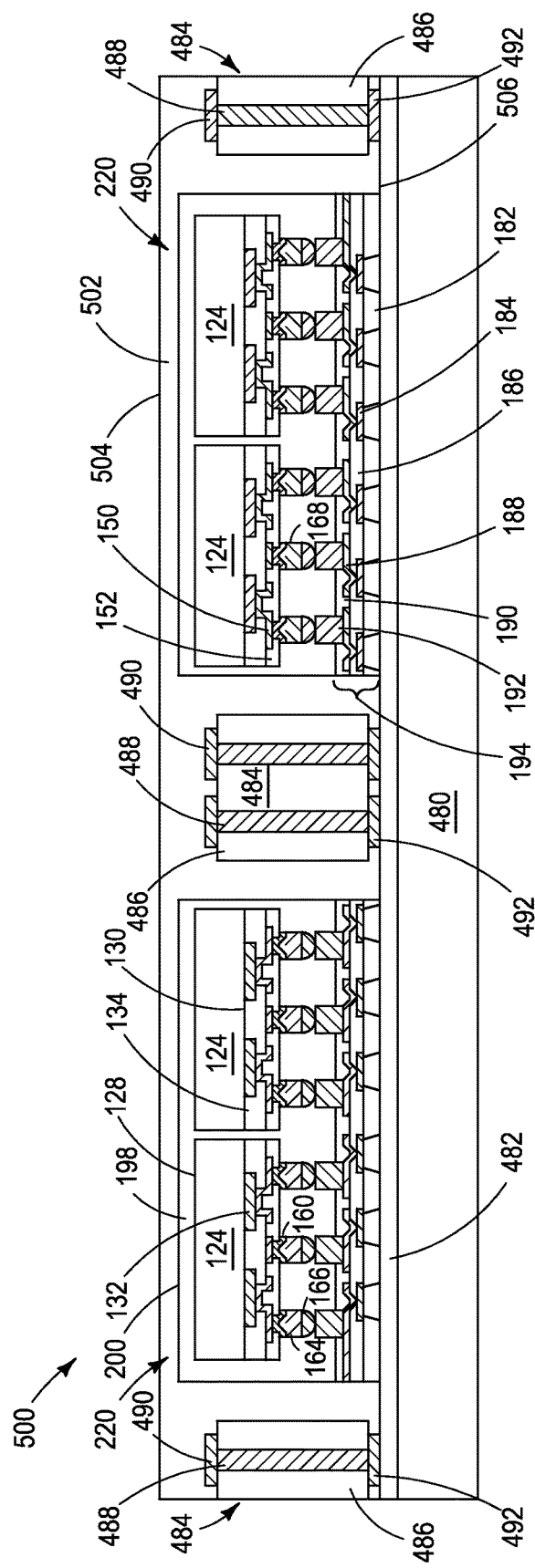

FIG. 8d shows WLCSP 220 and vertical interconnect units 484 mounted to carrier 480 to form a reconstituted wafer 500. In FIG. 8e, an encapsulant or molding compound 502 is deposited over WLCSP 220 and vertical interconnect unit 484 using a paste printing, compressive molding, transfer molding, liquid encapsulant molding, vacuum lamination, or other suitable applicator. Encapsulant 502 can be polymer composite material, such as epoxy resin with filler, epoxy acrylate with filler, or polymer with proper filler. Encapsulant 502 is non-conductive, provides physical support, and environmentally protects the semiconductor device from external elements and contaminants. Encapsulant 502 also protects semiconductor die 124 from degradation due to exposure to light. A surface 506 of encapsulant 502 opposite backside surface 504 is disposed over carrier 480 and interface layer 482 such that surface 506 of encapsulant 502 is coplanar with insulating layer 182 of WLCSP 220.

Figure 8F:
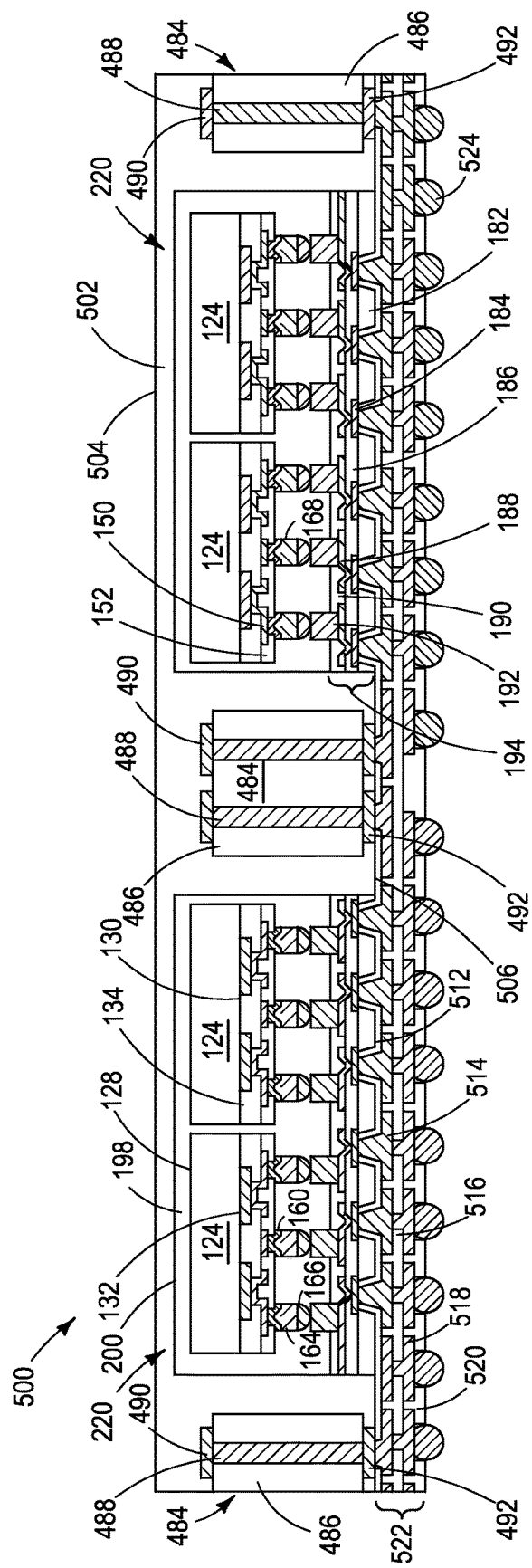

In FIG. 8f, carrier 480 and interface layer 482 are removed by chemical etching, mechanical peeling, CMP, mechanical grinding, thermal bake, UV light, laser scanning, or wet stripping, and a build-up interconnect structure 522 is formed over surface 506 of encapsulant 502, WLCSP 220, and vertical interconnect units 484. Build-up interconnect structure 522 includes insulating layer 512, conductive layer 514, insulating layer 516, conductive layer 518, and insulating layer 520.

Insulating or passivation layer 512 is formed over surface 506 of encapsulant 502, insulating layer 182 of WLCSP 220, and vertical interconnect units 484 using PVD, CVD, printing, spin coating, spray coating, sintering, or thermal oxidation. Insulating layer 512 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. A portion of insulating layer 512 is removed by LDA, etching, or other suitable process to expose conductive layer 184 of WLCSP 220 and conductive layer 492 of vertical interconnect units 484.

Electrically conductive layer or RDL 514 is formed over insulating layer 512 using a PVD, CVD, electrolytic plating, or electroless plating process. Conductive layer 514 can be one or more layers of Al, Cu, Sn, Ni, Au, Ag, Ti, W, TiW/Cu, Ti/Cu, or other suitable electrically conductive material. One portion of conductive layer 514 is electrically connected to conductive layer 184 of WL RDL 194. One portion of conductive layer 514 is electrically connected to conductive layer 492 of vertical interconnect units 484. Other portions of conductive layer 514 can be electrically common or electrically isolated depending on the design and function of semiconductor die 124. Conductive layer 514 includes a plurality of conductive traces. The conductive traces of conductive layer 514 are formed with a wider pitch than the conductive traces within WL RDL 194. In one embodiment, the conductive traces of conductive layer 514 have a pitch of 15 μm or greater.

Insulating or passivation layer 516 is formed over insulating layer 512 and conductive layer 514 using PVD, CVD, printing, spin coating, spray coating, sintering, or thermal oxidation. Insulating layer 516 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. A portion of insulating layer 516 is removed by LDA, etching, or other suitable process to expose conductive layer 514.

Electrically conductive layer or RDL 518 is formed over insulating layer 516 and conductive layer 514 using a PVD, CVD, electrolytic plating, or electroless plating process. Conductive layer 518 can be one or more layers of Al, Cu, Sn, Ni, Au, Ag, Ti, W, TiW/Cu, Ti/Cu, or other suitable electrically conductive material. One portion of conductive layer 518 is electrically connected to conductive layer 514. Other portions of conductive layer 518 can be electrically common or electrically isolated depending on the design and function of semiconductor die 124. Conductive layer 518 includes a plurality of conductive traces. The conductive traces of conductive layer 518 are formed with a wider pitch than the conductive traces of conductive layers 184 and 188 in WL RDL 194. In one embodiment, the conductive traces of conductive layer 518 have a pitch of 15 μm or greater.

Insulating or passivation layer 520 is formed over insulating layer 516 and conductive layer 518 using PVD, CVD, printing, spin coating, spray coating, sintering, or thermal oxidation. Insulating layer 520 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. In one embodiment, insulating layer 520 is a solder resist. A portion of insulating layer 520 is removed by LDA, etching, or other suitable process to expose conductive layer 518.

The combination of insulating layer 512, conductive layer 514, insulating layer 516, conductive layer 518, and insulating layer 520 constitutes build-up interconnect structure 522. The number of insulating and conductive layers included within build-up interconnect structure 522 depends on, and varies with, the complexity of the circuit routing design. Accordingly, build-up interconnect structure 522 can include any number of insulating and conductive layers to facilitate electrical interconnect with respect to semiconductor die 124. The larger pitch and relaxed design rule of the conductive traces within build-up interconnect structure 522 allows for greater flexibility in the materials and manufacturing techniques used in the fabrication of build-up interconnect structure 522, which reduces overall manufacturing costs.

An electrically conductive bump material is deposited over conductive layer 518 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 518 using a suitable attachment or bonding process. In one embodiment, the bump material is reflowed by heating the material above the material's melting point to form balls or bumps 524. In some applications, bumps 524 are reflowed a second time to improve electrical contact to conductive layer 518. In one embodiment, bumps 524 are formed over a UBM layer. Bumps 524 can also be compression bonded or thermocompression bonded to conductive layer 518. Bumps 524 represent one type of interconnect structure that can be formed over conductive layer 518. The interconnect structure can also use bond wires, conductive paste, stud bump, micro bump, or other electrical interconnect.

Figure 8G:
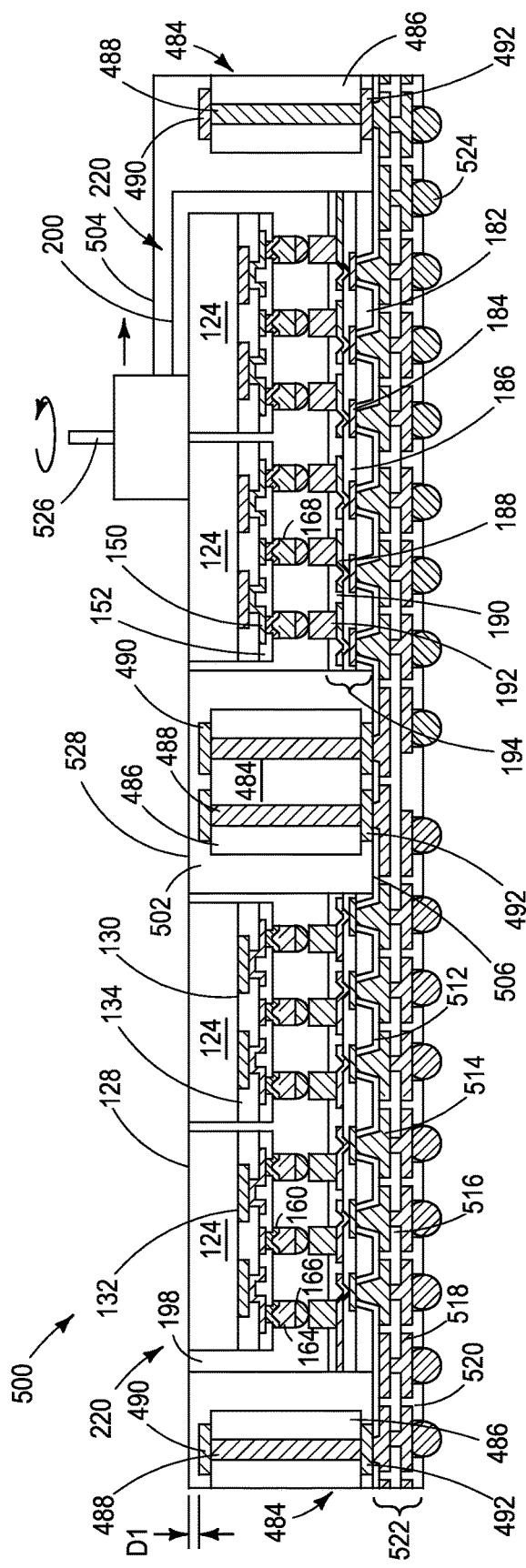

In FIG. 8g, a portion of encapsulant 502 is removed from surface 504 of encapsulant 502 using grinder 526. The backgrinding operation removes encapsulant 502 from over back surface 128 of semiconductor die 124 and reduces a thickness of reconstituted wafer 500. Removing encapsulant 502 also reduces warpage of reconstituted wafer 500. In one embodiment, a portion of semiconductor die 124 is removed from back surface 128 during the backgrinding operation to further thin reconstituted wafer 500. After backgrinding, encapsulant 502 remains over vertical interconnect units 484, and a surface 528 of encapsulant 502 is coplanar with surface 128 of semiconductor die 124. A thickness D1 between surface 528 of encapsulant 502 and conductive layer 490 is 10-50 µm. Laser marking of reconstituted wafer 500 for alignment, singulation, and/or package identification can be performed after backgrinding.

Figure 8H:
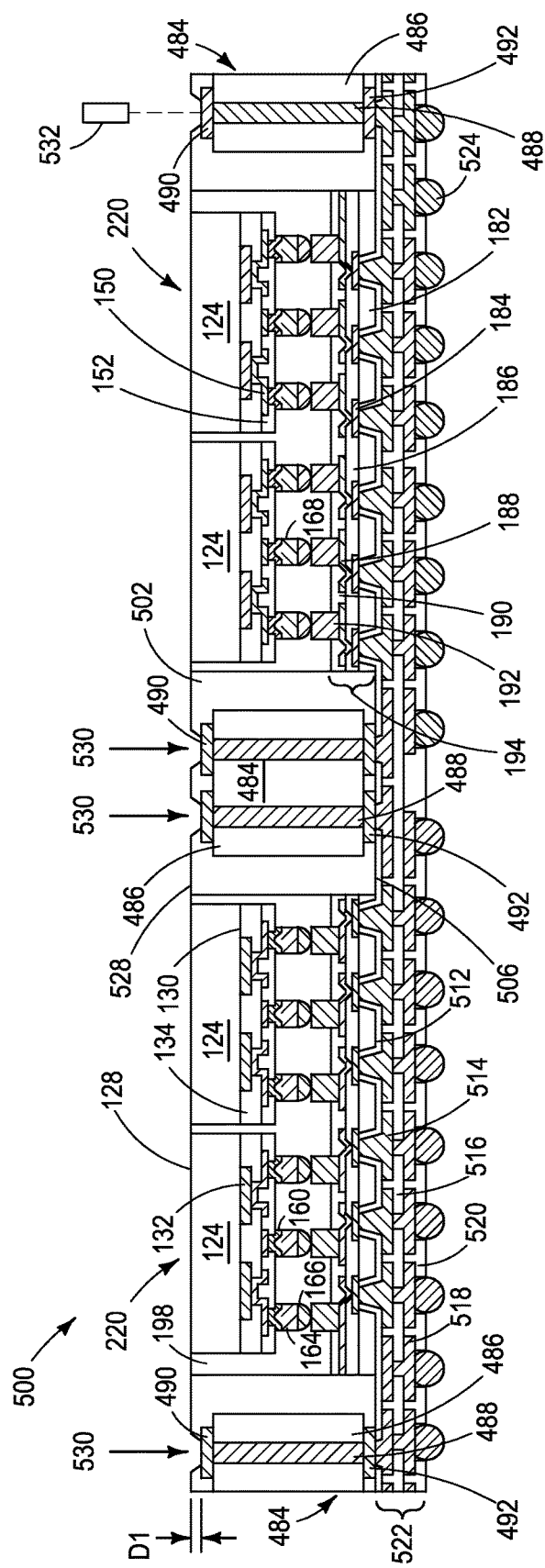

In FIG. 8h, a portion of encapsulant 502 is removed from over vertical interconnect units 484 to form openings 530. Openings 530 include a vertical or sloped sidewall and extend from surface 528 of encapsulant 502 to conductive layer 490 of vertical interconnect units 484. Openings 530 are formed by LDA using laser 532, etching, or other suitable process. By forming openings 530 through encapsulant 502 in a peripheral region of semiconductor die 124, a portion of conductive layer 490 is exposed from a backside of encapsulant 502. Openings 530 are configured to provide 3-D electrical interconnect between semiconductor die 124 and semiconductor die or devices, for example, memory devices, passive devices, saw filters, inductors, antenna, etc., stacked over WLCSP 220. In one embodiment, a finish such as Cu organic solderability preservative (OSP) is applied to exposed conductive layer 490 to prevent Cu oxidation. In an alternative embodiment, solder paste is printed on a surface of conductive layer 490 and reflowed to form a solder cap and protect the surface of conductive layer 490. In alternate embodiments, build-up interconnect structure 522 and bumps 524 are formed over reconstituted wafer 500 after forming openings 530.

Figure 8I:
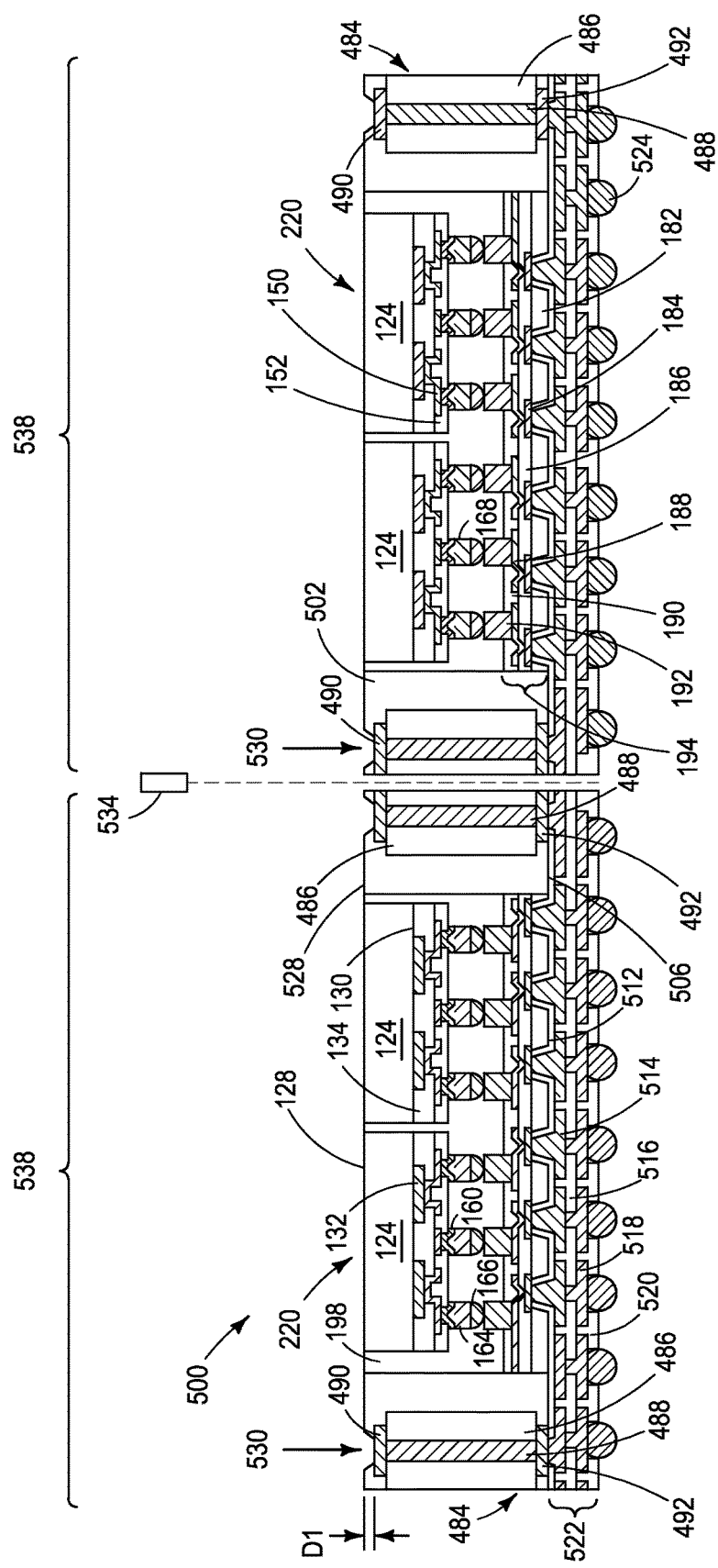

In FIG. 8i, reconstituted wafer 500 is singulated through build-up interconnect structure 522, core substrate 486 of vertical interconnect unit 484, and encapsulant 502 using a saw blade or laser cutting tool 534 into individual semiconductor devices 538 including WLCSP 220, vertical interconnect units 484, and build-up interconnect structure 522.

Figure 9:
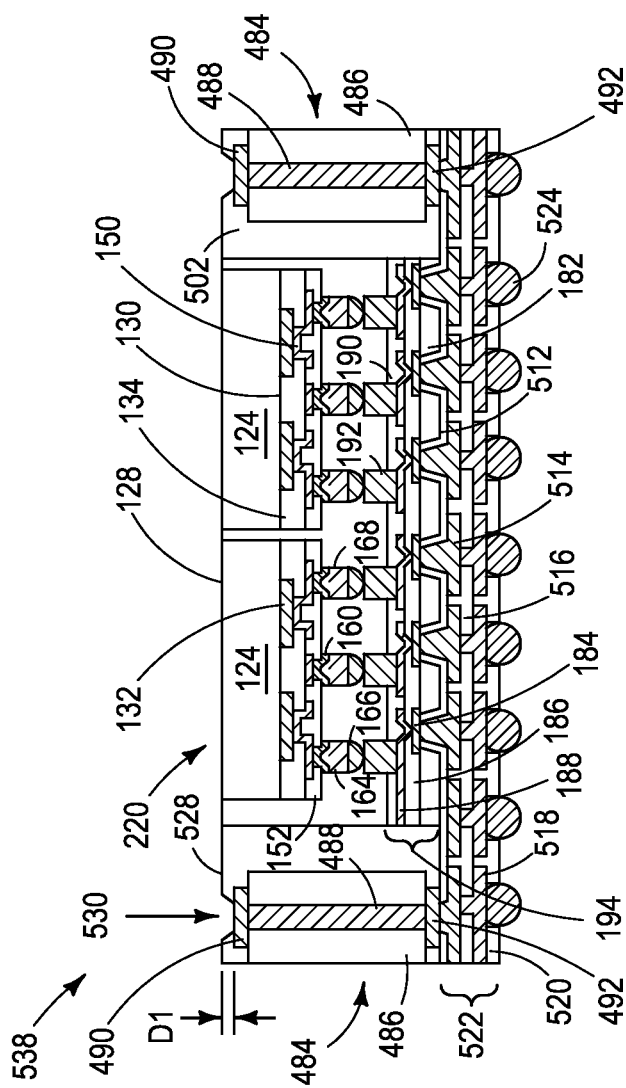
FIG. 9 illustrates a semiconductor device including fine pitch RDL and embedded vertical interconnect units.

FIG. 9 shows semiconductor device 538 after singulation. Semiconductor die 124 are electrically connected through WL RDL 194 and build-up interconnect structure 522 to bumps 524 for connection to external devices, for example a PCB. WL RDL 194 routes electrical signals between semiconductor die 124, and between semiconductor die 124 and build-up interconnect structure 522. Build-up interconnect structure 522 routes electrical signals between WLCSP 220, vertical interconnect units 484, and external devices. Forming two separate build-up interconnect structures, i.e., WL RDL 194 and build-up interconnect structure 522, allows the WL RDL 194 to utilize narrow pitch RDL fabrication techniques to increase I/O and electrical performance of semiconductor device 538, while build-up interconnect structure 522 utilizes standard Fo-eWLB fabrication techniques to minimize cost and provide additional routing to external components. The conductive layers 184 and 188 of WL RDL 194 are formed over temporary substrate 180 prior to attaching semiconductor die 124, providing a cost-effective way to form RDL, with ultra-narrow pitch, that are scalable to a submicron dimension, i.e., in a nanometer range. The narrow pitch of the conductive traces within conductive layers 184 and 188 allows for a higher density of interconnects within WL RDL 194. The high density of interconnects provides more flexibility in integration of semiconductor devices and accommodates semiconductor die with varying bump pitch, for example, semiconductor die from multiple manufacturing sources. Additionally, the narrow pitch of the conductive traces reduces the size of WL RDL 194 and shortens an interconnect distance, i.e., the distance an electrical signal must travel, between semiconductor die 124 and bumps 524. Shorter interconnect distance increases the speed and electrical performance of semiconductor device 538.

WL RDL 194 and build-up interconnect structure 522 within semiconductor device 538 are formed using processes, which are faster, less expensive, and lower risk than the processes used to form a TSV interposer package. Additionally, providing electrical interconnect without having to incorporate a TSV interposer reduces the dimensions and package profile semiconductor device 538. Forming WLCSP 220 prior to, and independent from, build-up interconnect structure 522 allows the signal routing between semiconductor die 124, and the functionality of WLCSP 220 to be tested prior to mounting WLCSP 220 to substrate 480. Accordingly, only known good WLCSP 220 are incorporated into semiconductor device 538. Using only known good WLCSP 220 to fabricate semiconductor device 538, prevents manufacturing time and materials from being wasted making a defective package and thus the yield of semiconductor devices 538 is increased and overall cost is reduced.

Build-up interconnect structure 522 provides additional conductive layers within semiconductor device 538. The additional conductive layers may be used for connection to other internal or external devices. Embedding vertical interconnect units 484 within encapsulant 502 provides electrical interconnect for devices disposed over semiconductor device 538 and increases the functionality and electrical performance of semiconductor device 538 without increasing the package profile. Conductive layers 514 and 518 of build-up interconnect structure 522 are formed with relaxed design rules using standard Fo-eWLB processes. Relaxing the design rules of build-up interconnect structure 522 allows for greater flexibility in the materials and manufacturing techniques used in the fabrication of build-up interconnect structure 522. For example, build-up interconnect structure 522 can be formed using standard Fo-eWLB equipment and materials, as opposed to materials specific to fabricating conductive layers with ultra-narrow pitch. The use of standardized equipment and materials reduces the manufacturing time and cost of semiconductor device 538. The wider pitch of the conductive traces within build-up interconnect structure 522 also provides greater flexibility in the placement and pitch of bumps 524. The pitch of bumps 524 can be selected to mirror industry standards. For example, bumps 524 can be formed with the same pitch as the interconnection pads on a standard PCB. In one embodiment, bumps 524 have a pitch of 0.4 mm. Relaxing the design rule of bumps 524 increases the compatibility of semiconductor device 538 and external devices and eliminates the need for an additional substrate or interposer.

Forming fine pitch WL RDL 194 on sacrificial substrate 180, transferring WL RDL 194 to semiconductor die 124 by chip-to-wafer molding, and forming build-up interconnect structure 522 over WLCSP 220 and vertical interconnect units 484 using standard Fo-eWLB fabrication processes allows semiconductor device 538 to incorporate semiconductor die with high and/or differing I/O requirements while minimizing the size, manufacturing time, and cost of semiconductor device 538.

Figure 10A:
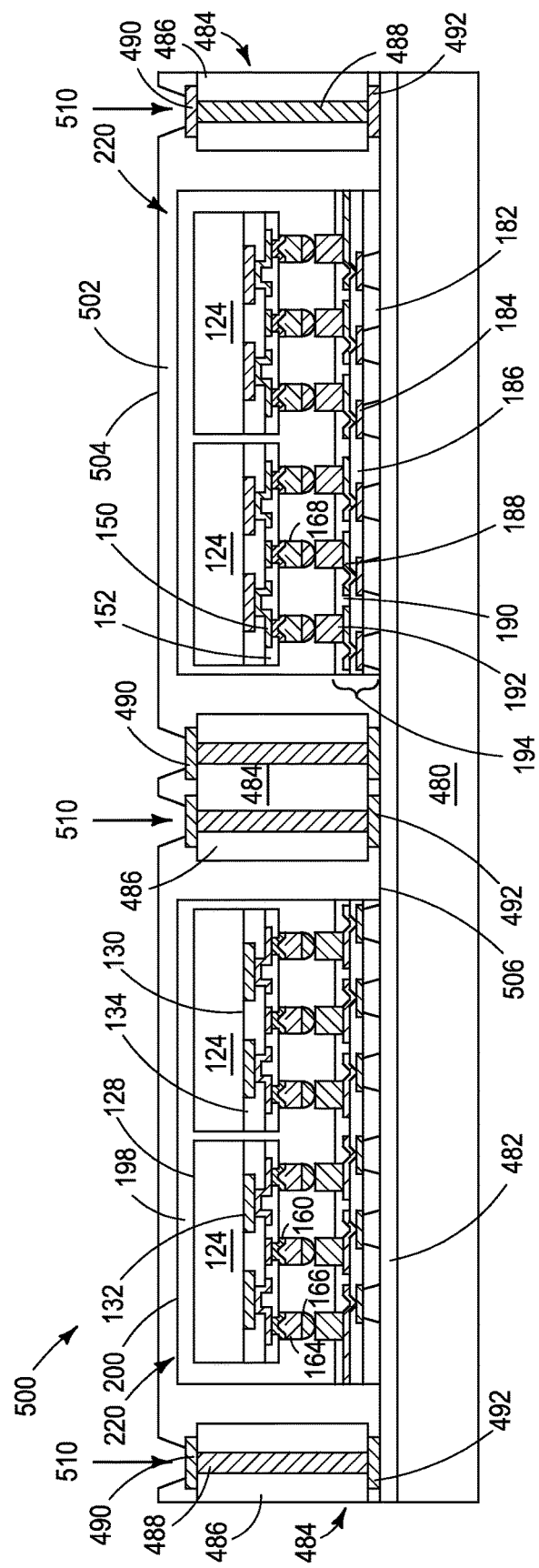
FIGS. 10a-10f illustrate a process of forming a semiconductor device with fine pitch RDL and dual-side RDL.

FIGS. 10*a*-10*f* illustrate, in relation to FIGS. 1 and 2*a*-2*c*, a process of forming dual-side RDL over a semiconductor device including fine pitch RDL and embedded vertical interconnect units. Continuing from FIG. 8*e*, FIG. 10*a* shows reconstituted wafer 500 including WLCSP 220 and vertical interconnect units 484 disposed over carrier 480 and interface layer 482. Encapsulant 502 is deposited over WLCSP 220 and vertical interconnect units 484. In one embodiment, a portion of encapsulant 502 is removed from surface 504 of encapsulant 502 in a subsequent backgrinding operation, similar to FIG. 8*g*.

A portion of encapsulant 502 is removed from over vertical interconnect units 484 to form openings 510. Openings 510 include a vertical or sloped sidewall and extend from surface 504 of encapsulant 502 to conductive layer 490 of vertical interconnect units 484. Openings 510 are formed by LDA, etching, or other suitable process. Openings 510 are formed in a peripheral region of semiconductor die 124, and expose a portion of conductive layer 490.

Figure 10B:
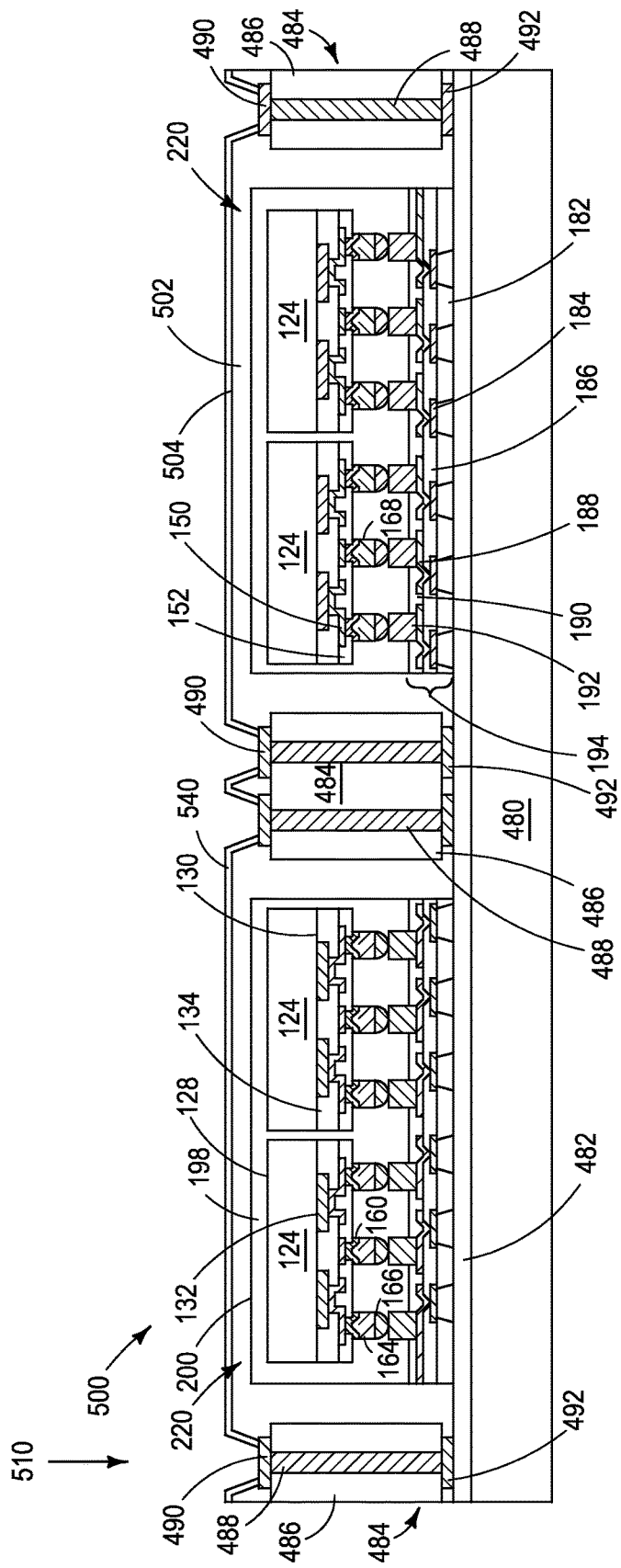

In FIG. 10*b*, an insulating or passivation layer 540 is formed over encapsulant 502 and vertical interconnect units 484 using PVD, CVD, printing, spin coating, spray coating, sintering, or thermal oxidation. Insulating layer 540 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. A portion of insulating layer 540 is removed by LDA, etching, or other suitable process to expose conductive layer 490 of vertical interconnect units 484.

Figure 10C:
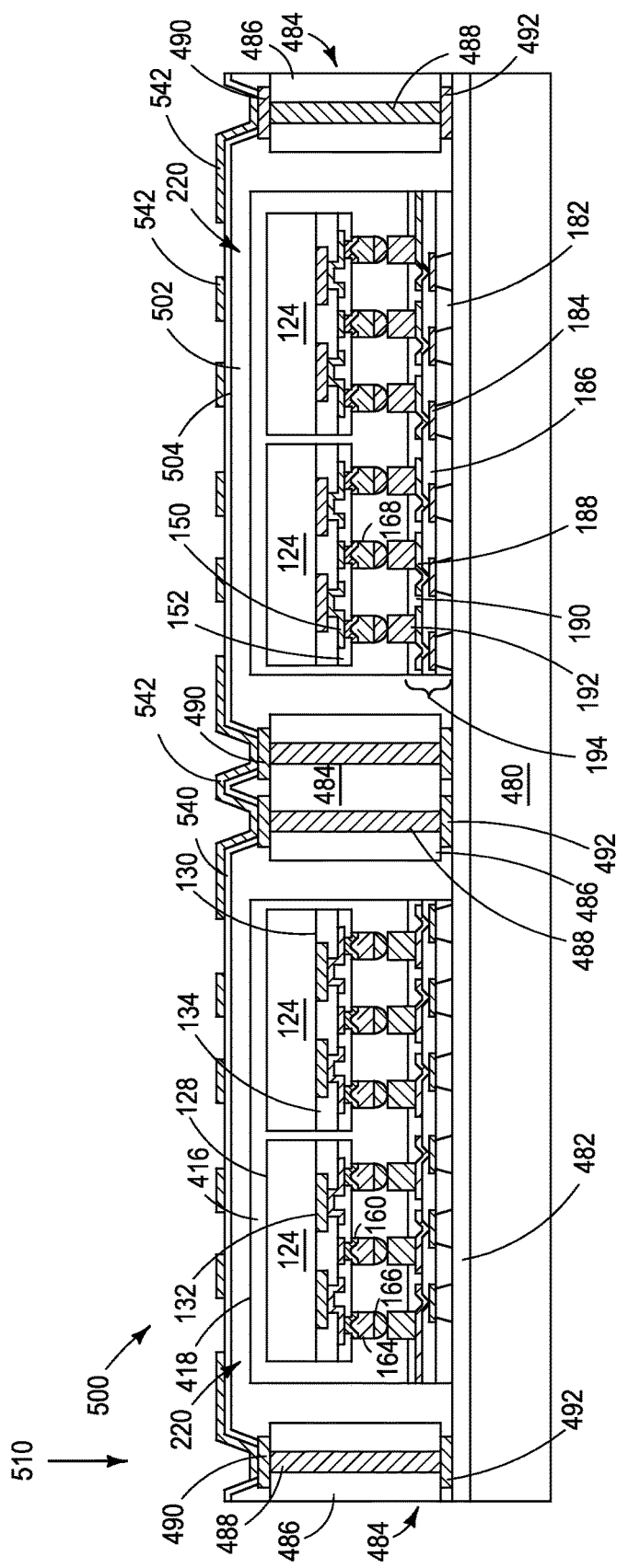

In FIG. 10*c*, an electrically conductive layer or RDL 542 is formed over insulating layer 540 and conductive layer 490 using a PVD, CVD, electrolytic plating, or electroless plating process. Conductive layer 542 can be one or more layers of Al, Cu, Sn, Ni, Au, Ag, Ti, W, TiW/Cu, Ti/Cu, or other suitable electrically conductive material. One portion of conductive layer 542 is electrically connected to conductive layer 490 of vertical interconnect units 484. Other portions of conductive layer 542 can be electrically common or electrically isolated depending on the design and function of semiconductor die 124 and later mounted semiconductor die or devices.

Figure 10D:
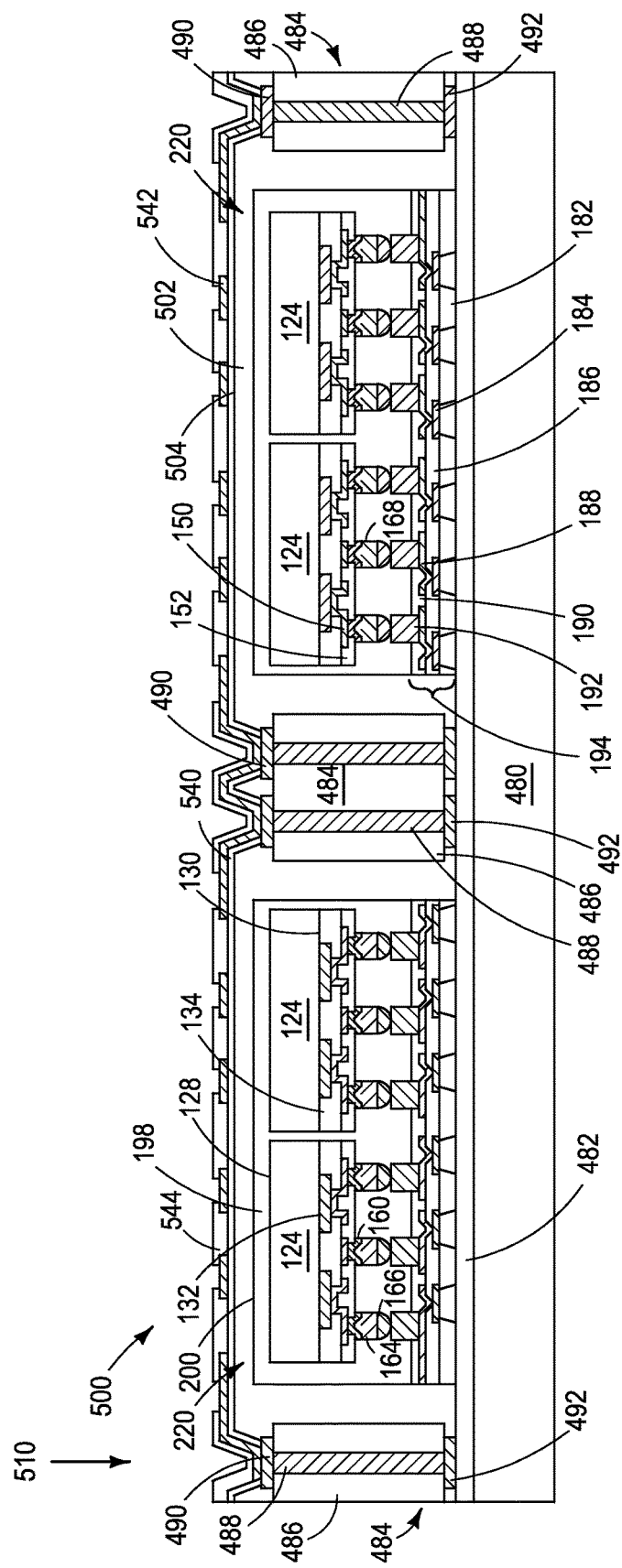

In FIG. 10*d*, an insulating or passivation layer 544 is formed over insulating layer 540 and conductive layer 542 using PVD, CVD, printing, spin coating, spray coating, sintering, or thermal oxidation. Insulating layer 544 includes one or more layers of Si3N4, SiO2, SiON, SiO2/Si3N4, Ta2O5, Al2O3, polymer dielectric, low temperature (less than 250° C.) curing polymer dielectric materials, or other material having similar insulating and structural properties. In one embodiment, insulating layer 544 is a solder resist. A portion of insulating layer 544 is removed by LDA, etching, or other suitable process to expose conductive layer 542. The exposed portions of conductive layer 542 provide 3-D electrical interconnect and facilitate the stacking of semiconductor die or devices, for example, memory devices, passive devices, saw filters, inductors, antenna, etc., over WLCSP 220.

Figure 10E:
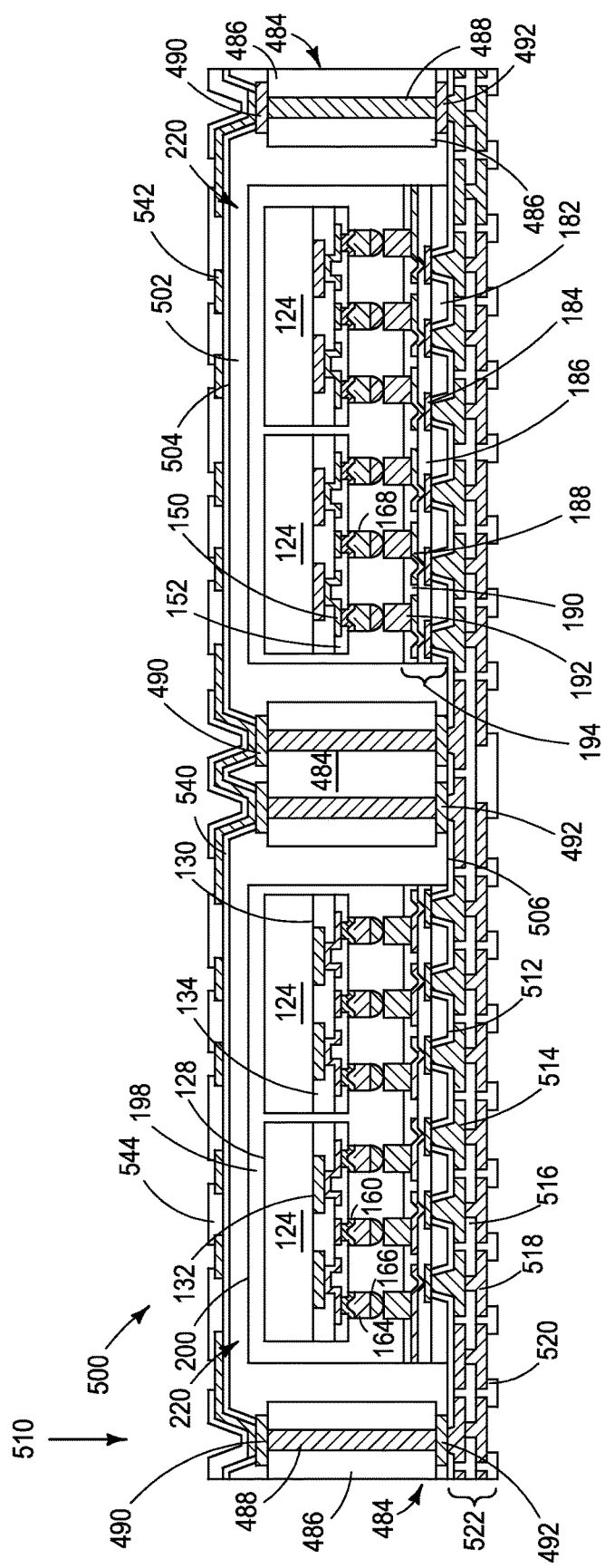

In FIG. 10*e*, carrier 480 and interface layer 482 are removed by chemical etching, mechanical peeling, CMP, mechanical grinding, thermal bake, UV light, laser scanning, or wet stripping, and build-up interconnect structure 522 including insulating layer 512, conductive layer 514, insulating layer 516, conductive layer 518, and insulating layer 520 is formed over surface 506 of encapsulant 502, WLCSP 220, and vertical interconnect units 484.

Figure 10F:
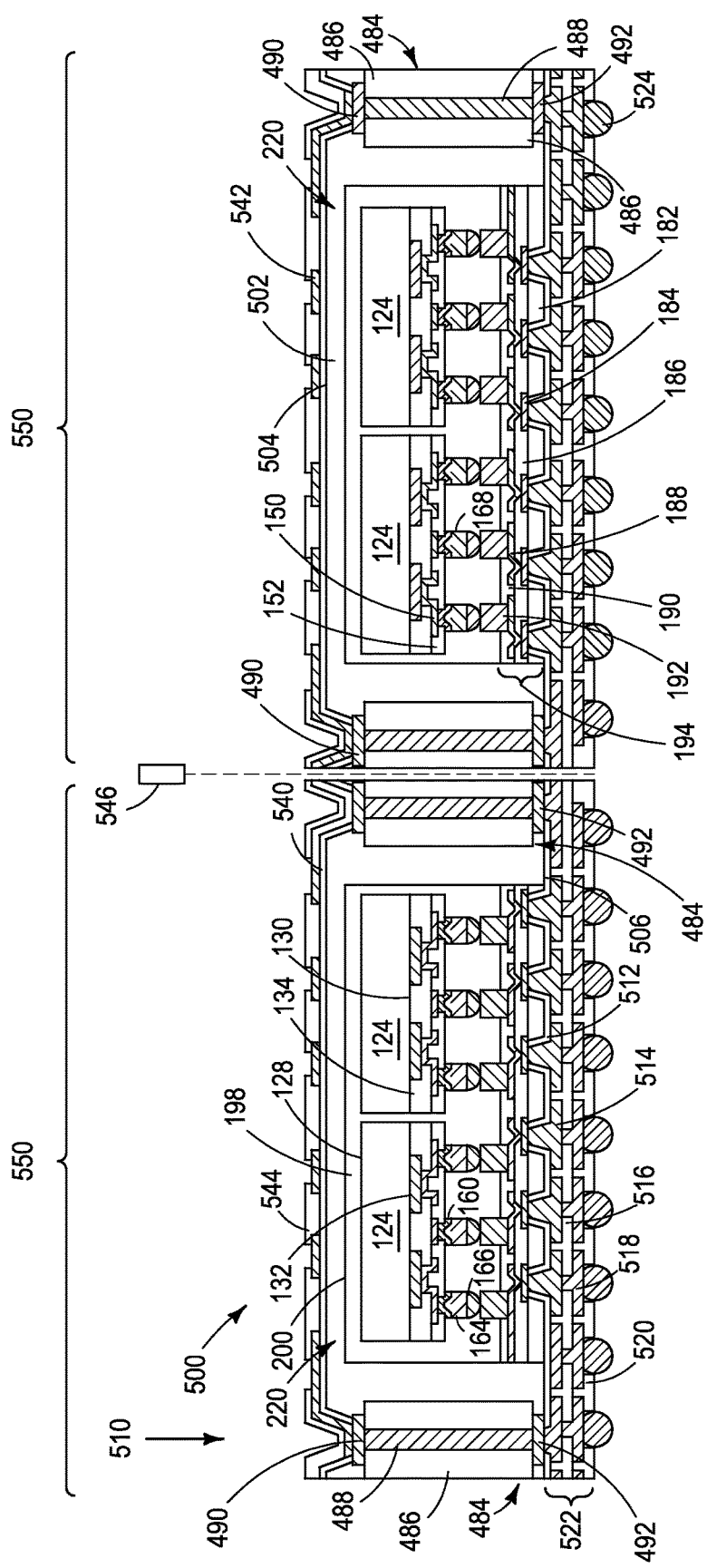

In FIG. 10*f*, bumps 524 are formed over conductive layer 518. Bumps 524 represent one type of interconnect structure that can be formed over conductive layer 518. The interconnect structure can also use bond wires, conductive paste, stud bump, micro bump, or other electrical interconnect. Alternatively, build-up interconnect structure 522 and bumps 524 are formed over reconstituted wafer 500 prior to forming openings 510 in encapsulant 502. Laser marking of reconstituted wafer 500 for alignment, singulation, and/or package identification can be performed before or after bump formation.

FIG. 10*f* further shows reconstituted wafer 500 is singulated through build-up interconnect structure 522, core substrate 486 of vertical interconnect unit 484, and encapsulant 502 using a saw blade or laser cutting tool 546 into individual semiconductor devices 550 including WLCSP 220, vertical interconnect units 484, and dual-side RDL, i.e., conductive layer 542 and conductive layers 514 and 518.

Figure 11:
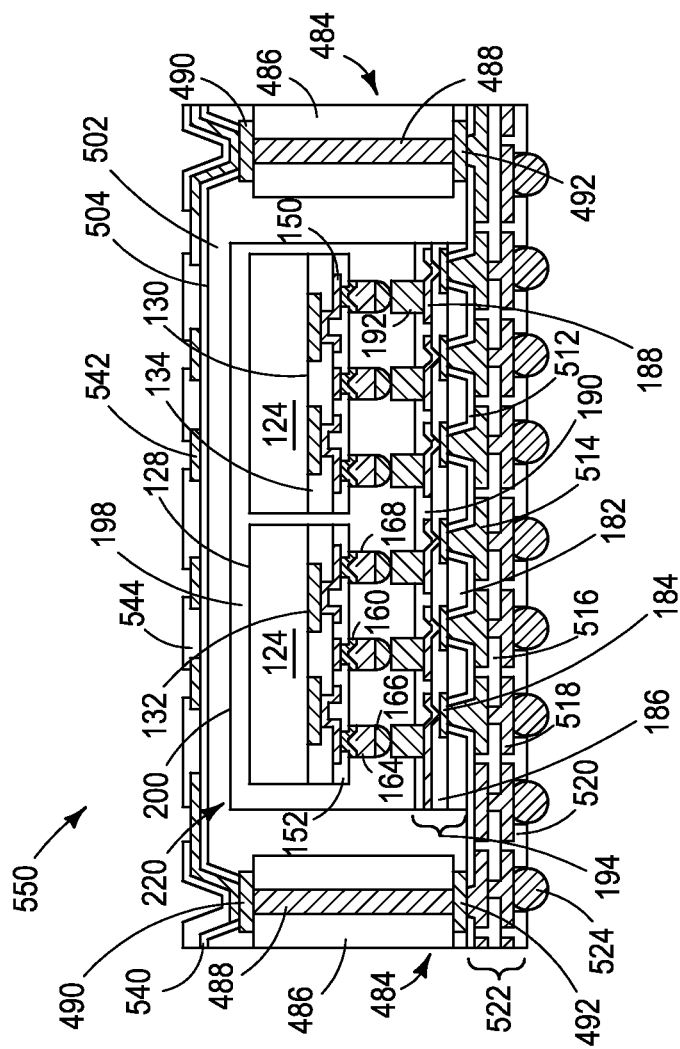
FIG. 11 illustrates a semiconductor device with fine pitch RDL and dual-side RDL.

FIG. 11 shows semiconductor device 550 after singulation. Semiconductor die 124 are electrically connected through WL RDL 194 and build-up interconnect structure 522 to bumps 524 for connection to external devices, for example a PCB. WL RDL 194 routes electrical signals between semiconductor die 124, and between semiconductor die 124 and build-up interconnect structure 522. Build-up interconnect structure 522 routes electrical signals between WLCSP 220, vertical interconnect units 484, and external devices. Forming two separate build-up interconnect structures, i.e., WL RDL 194 and build-up interconnect structure 522, allows the WL RDL 194 to utilize narrow pitch RDL fabrication techniques to increase I/O and electrical performance of semiconductor device 550, while build-up interconnect structure 522 utilizes standard Fo-eWLB fabrication techniques to minimize cost and provide additional routing to external components. The conductive layers 184 and 188 of WL RDL 194 are formed over temporary substrate 180 prior to attaching semiconductor die 124, providing a cost-effective way to form RDL, with ultra-narrow pitch, that are scalable to a submicron dimension, i.e., in a nanometer range. The narrow pitch of the conductive traces within conductive layers 184 and 188 allows for a higher density of interconnects within WL RDL 194. The high density of interconnects provides more flexibility in integration of semiconductor devices and accommodates semiconductor die with varying bump pitch, for example, semiconductor die from multiple manufacturing sources. Additionally, the narrow pitch of the conductive traces reduces the size of WL RDL 194 and shortens an interconnect distance, i.e., the distance an electrical signal must travel, between semiconductor die 124 and bumps 524. Shorter interconnect distance increases the speed and electrical performance of semiconductor device 550.

WL RDL 194 and build-up interconnect structure 522 within semiconductor device 550 are formed using processes, which are faster, less expensive, and lower risk than the processes used to form a TSV interposer package. Additionally, providing electrical interconnect without having to incorporate a TSV interposer reduces the dimensions and package profile semiconductor device 550. Forming WLCSP 220 prior to, and independent from, build-up interconnect structure 522 allows the signal routing between semiconductor die 124 and the functionality of WLCSP 220 to be tested prior to mounting WLCSP 220 to substrate 480. Accordingly, only known good WLCSP 220 are incorporated into semiconductor device 550. Using only known good WLCSP 220 to fabricate semiconductor device 550, prevents manufacturing time and materials from being wasted making a defective package and thus the yield of semiconductor device 550 is increased and overall cost is reduced.

Build-up interconnect structure 522 provides additional conductive layers within semiconductor device 550, which may be used for connection to other internal or external devices. Embedding vertical interconnect units 484 within encapsulant 502, and forming RDL over both sides of WLCSP 220, i.e., conductive layer 542 over surface 504 of encapsulant 502 and conductive layers 514 and 518 over surface 506 of encapsulant 502, facilitates the electrical interconnection and stacking of devices subsequently disposed over semiconductor device 570. Embedding vertical interconnect units 484 within encapsulant 502, and forming RDL over both sides of WLCSP 220 increases the functionality and electrical performance of semiconductor device 550 without increasing the package profile. Conductive layers 514 and 518 of build-up interconnect structure 522 are formed with relaxed design rules using standard Fo-eWLB processes. Relaxing the design rules of build-up interconnect structure 522 allows for greater flexibility in the materials and manufacturing techniques used in the fabrication of build-up interconnect structure 522. For example, build-up interconnect structure 522 can be formed using standard Fo-eWLB equipment and materials, as opposed to materials specific to fabricating conductive layers with ultra-narrow pitch. The use of standardized equipment and materials reduces the manufacturing time and cost of semiconductor device 550. The wider pitch of the conductive traces within build-up interconnect structure 522 also provides greater flexibility in the placement and pitch of bumps 524. The pitch of bumps 524 can be selected to mirror industry standards. For example, bumps 524 can be formed with the same pitch as the interconnection pads on a standard PCB. In one embodiment, bumps 524 have a pitch of 0.4 mm. Relaxing the design rule of bumps 524 increases the compatibility of semiconductor device 550 with external devices and eliminates the need for an additional substrate or interposer.

Forming fine pitch WL RDL 194 on sacrificial substrate 180, transferring WL RDL 194 to semiconductor die 124 by chip-to-wafer molding, and forming build-up interconnect structure 522 over WLCSP 220 and vertical interconnect units 484 using standard Fo-eWLB fabrication processes allows semiconductor device 550 to incorporate semiconductor die with high and/or differing I/O requirements while minimizing the size, manufacturing time, and cost of semiconductor device 550.

Figure 12:
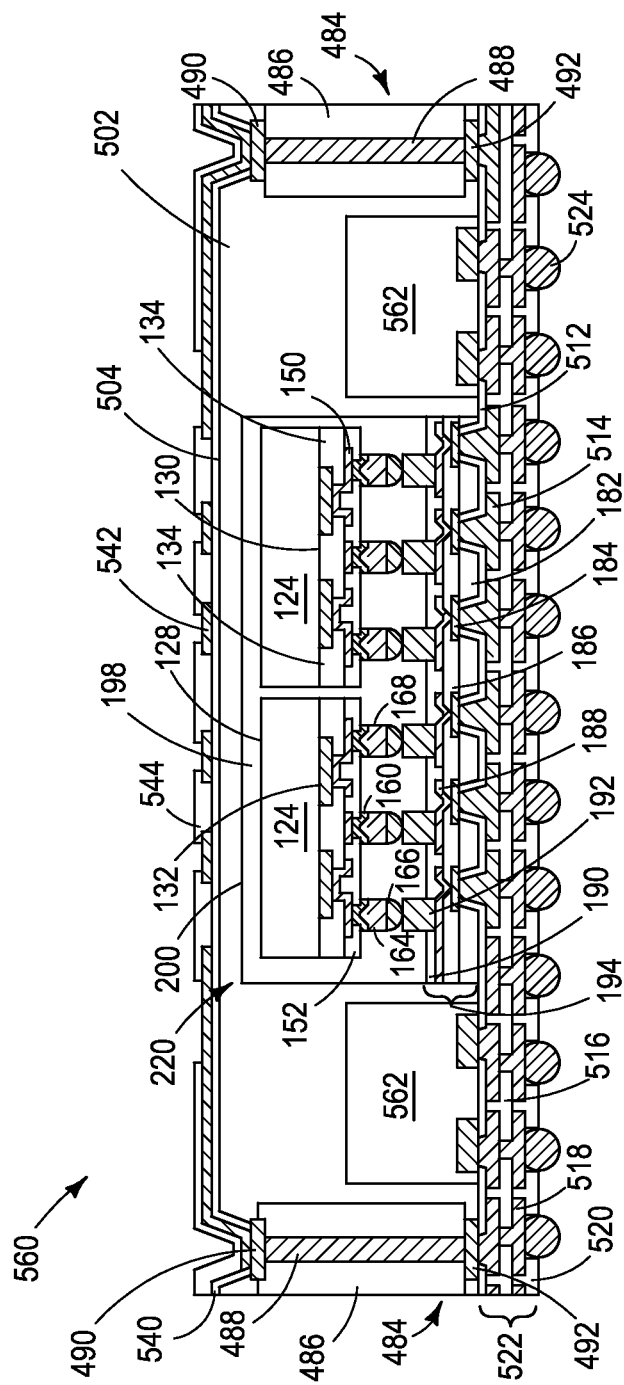
FIG. 12 illustrates a semiconductor device including fine pitch RDL, dual-side RDL, and embedded passive devices.

FIG. 12 shows a semiconductor device 560, similar to similar to semiconductor device 550 in FIG. 11. Semiconductor device 560 includes semiconductor components or passive devices 562 disposed within encapsulant 502. Passive devices 562 are electrically connected to build-up interconnect structure 522. Passive devices 562 embedded within semiconductor device 560 increase the functionality and electrical performance of semiconductor device 560.

Semiconductor die 124 are electrically connected through WL RDL 194 and build-up interconnect structure 522 to bumps 524 for connection to external devices. WL RDL 194 routes electrical signals between semiconductor die 124, and between semiconductor die 124 and build-up interconnect structure 522. Build-up interconnect structure 522 routes electrical signals between WLCSP 220, passive devices 562, vertical interconnect units 484, and external devices, for example a PCB. Forming two separate build-up interconnect structures, i.e., WL RDL 194 and build-up interconnect structure 522, allows the WL RDL 194 to utilize narrow pitch RDL fabrication techniques to increase I/O and electrical performance of semiconductor device 560, while build-up interconnect structure 522 utilizes standard Fo-eWLB fabrication techniques to minimize cost and provide additional routing to external components. The conductive layers 184 and 188 of WL RDL 194 are formed over temporary substrate 180 prior to attaching semiconductor die 124, providing a cost-effective way to form RDL, with ultra-narrow pitch, that are scalable to a submicron dimension, i.e., in a nanometer range. The narrow pitch of the conductive traces within conductive layers 184 and 188 allows for a higher density of interconnects within WL RDL 194. The high density of interconnects provides more flexibility in integration of semiconductor devices and accommodates semiconductor die with varying bump pitch, for example, semiconductor die from multiple manufacturing sources. Additionally, the narrow pitch of the conductive traces reduces the size of WL RDL 194 and shortens an interconnect distance, i.e., the distance an electrical signal must travel, between semiconductor die 124 and bumps 524. Shorter interconnect distance increases the speed and electrical performance of semiconductor device 560.

WL RDL 194 and build-up interconnect structure 522 within semiconductor device 560 are formed using processes, which are faster, less expensive, and lower risk than the processes used to form a TSV interposer package. Additionally, providing electrical interconnect without having to incorporate a TSV interposer reduces the dimensions and package profile semiconductor device 560. Forming WLCSP 220 prior to, and independent from, build-up interconnect structure 522 allows the signal routing between semiconductor die 124 and the functionality of WLCSP 220 to be tested prior to mounting WLCSP 220 to substrate 480. Accordingly, only known good WLCSP 220 are incorporated into semiconductor device 560. Using only known good WLCSP 220 to fabricate semiconductor device 560, prevents manufacturing time and materials from being wasted making a defective package and thus the yield of semiconductor device 560 is increased and overall cost is reduced.

Build-up interconnect structure 522 provides additional conductive layers within semiconductor device 560, which may be used for connection to other internal, for example passive device 562, or external devices. Embedding vertical interconnect units 484 within encapsulant 502, and forming RDL over both sides of WLCSP 220, i.e., conductive layer 542 over surface 504 of encapsulant 502 and conductive layers 514 and 518 over surface 506 of encapsulant 502, facilitates the electrical interconnection and stacking of devices subsequently disposed over semiconductor device 560. Embedding vertical interconnect units 484 within encapsulant 502, and forming RDL over both sides of WLCSP 220 increases the functionality and electrical performance of semiconductor device 560 without increasing the package profile. Conductive layers 514 and 518 of build-up interconnect structure 522 are formed with relaxed design rules using standard Fo-eWLB processes. Relaxing the design rules of build-up interconnect structure 522 allows for greater flexibility in the materials and manufacturing techniques used in the fabrication of build-up interconnect structure 522. For example, build-up interconnect structure 522 can be formed using standard Fo-eWLB equipment and materials, as opposed to materials specific to fabricating conductive layers with ultra-narrow pitch. The use of standardized equipment and materials reduces the manufacturing time and cost of semiconductor device 560. The wider pitch of the conductive traces within build-up interconnect structure 522 also provides greater flexibility in the placement and pitch of bumps 524. The pitch of bumps 524 can be selected to mirror industry standards. For example, bumps 524 can be formed with the same pitch as the interconnection pads on a standard PCB. In one embodiment, bumps 524 have a pitch of 0.4 mm. Relaxing the design rule of bumps 524 increases the compatibility of semiconductor device 560 with external devices and eliminates the need for an additional substrate or interposer.

Forming fine pitch WL RDL 194 on sacrificial substrate 180, transferring WL RDL 194 to semiconductor die 124 by chip-to-wafer molding, and forming build-up interconnect structure 522 over WLCSP 220, vertical interconnect units 484, and passive devices 562 using standard Fo-eWLB fabrication processes allows semiconductor device 560 to incorporate semiconductor die with high and/or differing I/O requirements while minimizing the size, manufacturing time, and cost of semiconductor device 560.

While one or more embodiments of the present invention have been illustrated in detail, the skilled artisan will appreciate that modifications and adaptations to the embodiments may be made without departing from the scope of the present invention as set forth in the following claims.

What is claimed:

1. A method of making a semiconductor device, comprising:
   providing a substrate;
   forming a conductive layer over the substrate;
   disposing a semiconductor die over the conductive layer;
   disposing a first encapsulant over the semiconductor die, substrate, and conductive layer;
   removing a portion of the substrate to expose the conductive layer after depositing the first encapsulant;
   disposing a second encapsulant around the first encapsulant and conductive layer after removing the portion of the substrate; and
   forming an interconnect structure over the conductive layer and second encapsulant.

2. The method of claim 1, further including disposing a first passive device over the conductive layer.

3. The method of claim 2, further including disposing a second passive device adjacent to the conductive layer.

4. The method of claim 1, further including:
   providing the substrate to include an insulating layer;
   forming the conductive layer over the insulating layer; and
   forming a plurality of openings in the insulating layer over the conductive layer.

5. The method of claim 4, further including removing the portion of the substrate prior to forming the openings in the insulating layer.

6. The method of claim 1, further including disposing an interconnect unit including a conductive via in a peripheral region of the semiconductor die.

7. A method of making a semiconductor device, comprising:
   providing a substrate;
   forming a first conductive layer over the substrate;
   disposing a first semiconductor die over the first conductive layer;
   disposing a second semiconductor die over the first conductive layer adjacent to the first semiconductor die;
   disposing a first encapsulant over the first semiconductor die, second semiconductor die, and first conductive layer;
   singulating through the first encapsulant with the first semiconductor die remaining attached to the second semiconductor die by the first encapsulant;
   removing a portion of the substrate over the first conductive layer;
   depositing a second encapsulant over the first semiconductor die, second semiconductor die, first conductive layer, and first encapsulant after singulating through the first encapsulant; and
   forming an interconnect structure over the first conductive layer opposite the first semiconductor die.

8. The method of claim 7, wherein forming the interconnect structure includes forming a second conductive layer over the first encapsulant and first conductive layer by performing a metal deposition technique onto the first conductive layer.

9. The method of claim 7, further including disposing a passive device in a peripheral region of the first semiconductor die.

10. The method of claim 9, further including depositing the second encapsulant over the passive device and first semiconductor die.

11. The method of claim 7, further including:
    disposing vertical interconnect structure in a peripheral region of the first semiconductor die;
    depositing the first encapsulant around the first semiconductor die and vertical interconnect structure; and
    forming an opening in the first encapsulant over the vertical interconnect structure.

12. The method of claim 7, further including forming a composite interconnect structure over the first semiconductor die.

13. A method of making a semiconductor device, comprising:
   providing a substrate;
   forming a first interconnect structure over the substrate;
   disposing a first semiconductor die over the first interconnect structure;
   disposing a second encapsulant over the first semiconductor die and first interconnect structure;
   singulating through the second encapsulant;
   disposing a first encapsulant over the first semiconductor die and first interconnect structure after singulating through the second encapsulant;
   removing a portion of the substrate over the first interconnect structure; and
   forming a second interconnect structure over the first encapsulant and first interconnect structure.

14. The method of claim 13, further including disposing a passive device over the first interconnect structure.

15. The method of claim 13, further including disposing a passive device adjacent to the first interconnect structure.

16. The method of claim 13, further including disposing a vertical interconnect structure in a peripheral region of the first semiconductor die.

17. The method of claim 16, further including forming an opening in the first encapsulant over the vertical interconnect structure.

18. The method of claim 13, further including disposing a second semiconductor die over the first interconnect structure.

19. A method of making a semiconductor device, comprising:
   providing a substrate including an insulating layer and a conductive layer;
   forming a first interconnect structure over the substrate and connected to the conductive layer;
   disposing a semiconductor die over the first interconnect structure;
   disposing a first encapsulant over the substrate, first interconnect structure, and semiconductor die; and
   removing a portion of the insulating layer after forming the first interconnect structure to expose the conductive layer.

20. The method of claim 19, further including disposing a second encapsulant around the substrate, semiconductor die, first interconnect structure, and first encapsulant.

21. The method of claim 19, further including disposing a vertical interconnect structure in a peripheral region of the semiconductor die.

22. The method of claim 20, further including forming a second interconnect structure over the second encapsulant outside a footprint of the first encapsulant.

23. The method of claim 20, further including singulating through the first encapsulant prior to depositing the second encapsulant.

* * * * *